US006452206B1

(12) United States Patent
Harman et al.

(10) Patent No.: US 6,452,206 B1
(45) Date of Patent: *Sep. 17, 2002

(54) SUPERLATTICE STRUCTURES FOR USE IN THERMOELECTRIC DEVICES

(75) Inventors: Theodore C. Harman, Lexington; Mildred S. Dresselhaus, Arlington; David L. Spears, Acton; Michael P. Walsh, Lunenberg; Stephen B. Cronin, Cambridge; Xiangzhong Sun, Cambridge; Takaaki Koga, Cambridge, all of MA (US)

(73) Assignee: Massachusetts Institute of Technology, Cambridge, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/039,602

(22) Filed: Mar. 16, 1998

Related U.S. Application Data

(60) Provisional application No. 60/040,936, filed on Mar. 17, 1997.

(51) Int. Cl.$^7$ ............ H01L 29/225; H01L 23/38; H01L 27/16; H01L 35/14
(52) U.S. Cl. ............ 257/22; 257/17; 257/183; 257/467; 257/614; 257/930
(58) Field of Search ............ 257/17, 22, 183, 257/467, 614, 930

(56) References Cited

U.S. PATENT DOCUMENTS

| | | | |
|---|---|---|---|
| 2,588,254 A | 3/1952 | Lark-Horovitz et al. | 136/89 |
| 2,798,989 A | 7/1957 | Welker | 317/237 |
| 3,124,936 A | 3/1964 | Melehy | 62/3 |

(List continued on next page.)

FOREIGN PATENT DOCUMENTS

| | | | |
|---|---|---|---|
| EP | 0437654 | 7/1991 | H01L/35/18 |
| GB | 1216001 | 12/1970 | |
| JP | 08125237 | 5/1996 | H01L/35/32 |
| WO | WO 98 42034 | 9/1998 | |
| WO | WO 98/44562 | 10/1998 | |

OTHER PUBLICATIONS

Fredorenko, A. I. et al.; "The Expitaxial Growth of IV–VI Heterostructures and Superlattices on (001) Si" Thin Solid Films 267, Oct. 15, 1995, pp. 134–137.

Pinczolits M et. At.; "Direct Formation of Self—Assembled Quantum Dots Under Tensile Strain by Heteroepitaxy of PbSE on PBTe (111)" Applied Physics. New York, vol. 73, No. 2, Jul. 13, 1998, pp. 250–252.

Harman, T C. "Thermoelectric Quantum—Dot Superlattices with High ZT" Journal of Electronic Materials, Jan. 2000, IEEE, vol. 29, No. 1, Jan. 2000, pp. 11–14.

(List continued on next page.)

Primary Examiner—Jerome Jackson, Jr.
(74) Attorney, Agent, or Firm—Daly, Crowley & Mofford LLP

(57) ABSTRACT

A superlattice structure for thermoelectric power generation includes m monolayers of a first barrier material alternating with n monolayers of a second quantum well material with a pair of monolayers defining a superlattice period and each of the materials having a relatively smooth interface therebetween. Each of the quantum well layers have a thickness which is less than the thickness of the barrier layer by an amount which causes substantial confinement of conduction carriers to the quantum well layer and the alternating layers provide a superlattice structure having a figure of merit which increases with increasing temperature.

21 Claims, 12 Drawing Sheets

U.S. PATENT DOCUMENTS

| | | | |
|---|---|---|---|
| 3,259,759 A | 7/1966 | Giaever | 307/88.5 |
| 3,296,033 A | 1/1967 | Scuro et al. | 136/205 |
| 3,338,753 A | 8/1967 | Horsting | 136/237 |
| 3,342,567 A | 9/1967 | Dingwall | 29/195 |
| 3,626,583 A | 12/1971 | Abbott et al. | 29/573 |
| 3,674,568 A | 7/1972 | Caprarola | 136/205 |
| 3,873,370 A | 3/1975 | Hampl, Jr. et al. | 136/205 |
| 4,029,520 A | 6/1977 | Hampl, Jr. et al. | 136/205 |
| 4,261,771 A | 4/1981 | Dingle et al. | 148/175 |
| 4,368,416 A | 1/1983 | James | 322/2 R |
| 4,469,977 A | 9/1984 | Quinn et al. | 310/334 |
| 4,620,897 A | 11/1986 | Nakajima | 156/602 |
| 4,664,960 A | 5/1987 | Ovshinsky | 428/98 |
| 4,786,335 A | 11/1988 | Knowles et al. | 136/214 |
| 4,847,666 A | 7/1989 | Heremans et al. | 357/16 |
| 4,855,810 A | 8/1989 | Gelb et al. | 357/87 |
| 4,869,971 A | 9/1989 | Nee et al. | 428/635 |
| 5,006,178 A | 4/1991 | Bijvoets | 136/211 |
| 5,021,224 A | 6/1991 | Nakajima | 422/248 |
| 5,051,786 A | 9/1991 | Nicollian et al. | 357/4 |
| 5,064,476 A | 11/1991 | Recine, Sr. | 136/201 |
| 5,156,004 A | 10/1992 | Wu et al. | 62/3.1 |
| 5,181,086 A | 1/1993 | Yoshida | 257/18 |
| 5,210,428 A | 5/1993 | Goosen | 257/17 |
| 5,288,336 A | 2/1994 | Strachan et al. | 136/200 |
| 5,415,699 A | 5/1995 | Harman | 136/238 |
| 5,436,467 A | 7/1995 | Elsner et al. | 257/15 |
| 5,886,390 A * | 3/1999 | Nishimoto | 257/930 |
| 5,900,071 A * | 5/1999 | Harman | 257/614 |

OTHER PUBLICATIONS

Asahi H. "Self—Organized Quantum Wires and Dots in III—V Semiconductors" Advanced Materials, vol. 9, No. 13, Nov. 3, 1997, pp. 1019–1026.

Holy, V. et al. "Strain Induced Vertical and Lateral Correlations in Quantum Dot Superlattices", Physical Review Letters, vol. 83, No. 2, Jul. 1999, pp. 356–359.

"Solid–State Superlattices" by Gottfied H. Dö hler, *Scientific American*, V. 249, No. 5, 11/83, pp. 144–151.

T.E. Whall and E.H.C. Parker, "Preparation of Advanced Materials by Molecular Beam Epitaxy," in *Proc. First Europe Conf. on Thermoelectrics*, D.M. Rowe, ed. (Peter Peregrinus Ltd., London 1987) Chapter 5, pp. 51–63.

Katsuya Oda and Takashi Nakayama, "Effects of Interface Atomic Configurations on Electronic Structures of Semiconductor Superlattices," *Jpn. J. Appl. Phys.* 1992, vol. 31, Part 1, No. 8, pp. 2359–2368.

Kaoru Inoue, et al., "Electron Mobilities in Modulation–Doped $Al_xGa_{i-x}As/GaAs$ and Pseudomorphic $Al_xGa_{i-x}As/In_yGa_{i-y}As$ Quantum–Well Structures," *Physical Review B*, 1993, vol. 47, No. 7, pp. 3771–3778.

Mark L. Biermann, et al., "Wave–Packet Theory of Coherent Carrier Dynamics in a Semiconductor Superlattice," *Physical Review B*, 1993, vol. 47, No. 7, pp. 3718–3717.

L.D. Hicks, et al., "Use of Quantum–well Superlattices to Obtain a High Figure of Merit from Non–Conventional Thermoelectric Materials" 1993 *Appl. Phys. Lett.* vol. 63(23), pp. 3230–3232.

G.D. Mahan, et al., "Thermoelectric Devices Using Semiconductor Quantum Wells" 1994 *J.Appl. Phys.* vol. 76 (3), pp. 1899–1901.

X. Sun, et al., "Quantum Confinement Effects on the Thermoelectric Figure of Merit in $Si/Si_{1-x}Ge$ System" 1997 *Mat. Res. Soc. Symp. Proc.* vol. 478.

L.D. Hicks, et al., "Experimental Study of the Effect of Quantum–Well Structures on the Thermoelectric Figure of Merit" 1996 *Physical Review B*, vol. 53, No. 16.

L.D. Hicks, et al., "Thermoelectric Figure of Merit of a One–Dimensional Conductor" 1993 *Physical Review B*, Vo. 47, No. 24.

T.C. Harman, et al. "High Thermoelectric Figures of Merit in PbTe Quantum Wells" 1996 *Journal of Electronic Materials*, vol. 25, No. 7.

Farmer, et al., "Sputter Deposition of Multilayer Thermoelectric Films: An Approach to the Fabrication of Two–Dimensional Quantum Wells" 1995, XIII Intl. Conf. on Therm., *American Institute of Physics*.

M. S. Dresselhaus, et al., "Prospects for High Thermoelectric Figures of Merit in 2D System," 1997 *Mat. Res. Soc. Symp. Proc.* vol. 478.

L. D. Hicks, et al., "Use of Quantum–Well Superlattices to Increase the Thermoelectric Figure of Merit: Transport and Optical Studies," 1995 *Mat. Res. Soc. Symp. Proc.* vol. 358.

L. D. Hicks, "Effect of Quantum–Well Structures on the Thermoelectric Figure of Merit," 1993 *Physical Review B* vol. 47, No. 19.

* cited by examiner

SUPERLATTICE STRUCTURES FOR USE IN THERMOELECTRIC DEVICES

RELATED APPLICATIONS

This application claims priority under 35 U.S.C. §119(e) from application Ser. No. 60/040,936 filed Mar. 17, 1997.

U.S. GOVERNMENT INTEREST

This invention was developed pursuant to research sponsored in part by the U.S. Government under the Department of Army and the Department of the Navy under AF Contract Nos. F19628-90-C-0002 and F19628-95-C-0002. The U.S. Government may have certain rights in the invention.

FIELD OF THE INVENTION

This invention relates generally to thermoelectric materials and more particularly to superlattice structures used in thermoelectric materials.

BACKGROUND OF THE INVENTION

Superlattice structures, in general, are known and typically comprise a composite made of alternating ultrathin layers of different materials. Typically, the superlattice has an energy band structure which is different than, but related to, the energy band structure of the component materials. By the appropriate choice of materials (and other factors discussed below), a superlattice having a desired energy band structure and other characteristics can be produced.

Superlattices have many uses, including, but not limited to, use in the field of thermoelectric cooling materials. Whall and Parker have suggested using a superlattice prepared by molecular beam epitaxy (MBE) to enhance the thermoelectric figure of merit of a thermoelectric material. They expressed particular interest in silicon and SiGe alloys, but also mentioned the possibility of using PbTe, InAs and the transition silicates (e.g. Cobalt $Si_2$). Specifically, a strained-layer superlattice consisting of 20 or more layers of Si and SiGe composition was suggested.

The use of MBE to grow superlattice structures (e.g., GaAs and AlAs) is disclosed in U.S. Pat. No. 4,261,771 issued to Dingle, et al. As disclosed in Dingle et al., the general technique for fabricating a superlattice by MBE comprises the following standard steps: (1) obtaining a substrate (e.g., from a commercial source); (2) cleaning a major surface of the substrate using standard preparation procedures; (3) placing the substrate in an evacuable metal chamber; (4) reducing the chamber pressure; (5) loading shuttered effusion cells (ovens) with the requisite source materials for growth; (6) heating the substrate to about 600 degrees C., to cause desorption of contaminants from the growth surface and then adjusting the substrate temperature to that desired for growth; (7) with the shutters closed, heating the ovens until the source materials vaporize; and (8) opening selected shutters to effect growth until the desired layer thickness is attained.

According to Dingle et al., the fabrication process can be described as forming a new composition of matter of A (e.g., GaAs) and B (e.g., AlAs or Ge) by directing a periodically pulsed molecular beam at a substrate. During the first part of each period an A-beam is directed at the substrate for a time effective to grow material A having a thickness of n monolayers and during the second part of each period directing a B-beam at the substrate for a time effective to grow-material B having a thickness of m monolayers.

Therefore, the fabrication of a superlattice by MBE, or other known epitaxial growth techniques, is generally known. However, the choice of materials and the relative amounts of the materials which make up the superlattice are predominant factors in determining the characteristics of the superlattice. For use as a thermoelectric material, it is desirable to choose the materials, and their relative amounts, so that the thermoelectric figure of merit is maximized.

The thermoelectric figure of merit (ZT) is a measure of the effectiveness of a material and is related to material properties by the following equation:

$$ZT = S^2 \sigma T / K,$$

where S, σ, K, and T are the Seebeck coefficient, electrical conductivity, thermal conductivity and temperature, respectively. The Seebeck coefficient (S) is a measure of how readily electrons (or holes) can change energy in a temperature gradient as they move across a thermoelement, and is related to the strength of interaction of charge carriers with the lattice and the available energy states. The highest useful Seebeck coefficients are found in semiconductor materials with low crystal symmetry. In theory, to maximize ZT, one would try to maximize S, σ and T and minimize K. However, in practice, this is not so simple. For example, as a material is doped to increase its electrical conductivity (σ), bandfilling tends to lower S and the electron component, $K_e$ of K increases. In most materials, ZT is maximized at doping levels approaching $10^{19}$ $cm^{-3}$. Since increasing (or decreasing) one parameter may adversely increase (or decrease) another parameter, it is important to select carefully the component materials to provide a high ZT. Currently, the best thermoelectric cooling materials have a ZT of approximately 1, at 300 K.

The figure of merit ZT is related to the thermoelectric materials factor (b*) where:

$$b^* = \mu m^{*3/2} / K_L;$$

where μ is the carrier mobility, m* is the density of states effective mass and $K_L$ is the lattice thermal conductivity. The precise relationship between b* and ZT is complex. However, for simplicity, it may be approximated as follows. If it assumed that $b^{**} = b^* T^{5/2}$ and that there is one-band conduction, then ZT increases monotonically as b** increases.

A superlattice provides the opportunity to enhance ZT for a number of reasons. For example, it is known that the Seebeck coefficient increases as the period of a quasi-two-dimensional superlattice decreases. The electrical conductivity may be enhanced by means of modulation doping, which has been shown to increase the carrier mobilities in Si/SiGe strained-layer superlattices. Furthermore, the lattice thermal conductivity of a small-period superlattice is expected to be substantially lower than the average of the component materials because of augmented Umklapp phonon—phonon scattering process (in which the total phonon vector is not conserved, but rather changes by 2π times the reciprocal lattice vector) due to phonon-interface scattering effects.

SUMMARY OF THE INVENTION

In accordance with the present invention, a superlattice structure includes m monolayers of a first barrier material alternating with n monolayers of a second quantum well material with a pair of monolayers defining a superlattice period and each of the materials having a relatively smooth interface therebetween. Each of the quantum well layers have a thickness which is less than the thickness of the barrier layer by an amount which at least partially confines and in some instances causes substantial confinement of conduction carriers to the quantum well layer. The alternating layers of the first barrier material and the second quantum well material provide a superlattice structure having a figure of merit which increases with increasing temperature beyond that achievable with bulk materials. With this particular arrangement, a superlattice structure which may be used for various purposes including, but without limitation, thermoelectric power generation, thermoelectric cooling, electronic devices and electrooptic devices. For example, a superlattice according to the present invention may be made of alternating layers of a first material and a second material, where the first material comprises PbTe and where the second material comprises materials selected from the group consisting of Pb, Sn, Ge, Te, Se, S, Sb, As or P. For example, but without limitation, the superlattice may be made of alternating monolayers of PbTe and PbEuTe. More particularly, the superlattice may be provided from alternating layers of $(PbEuTe)_m$ and $(PbTe)_n$ (where m and n are the number of PbEuTe and PbTe monolayers per superlattice period, respectively) having engineered electronic structures for improved thermoelectric power generation materials and other uses. Such superlattices may be made fabricated via epitaxial techniques such as by molecular beam epitaxial (MBE) growth. In one particular embodiment, the superlattice may be provided from m layers of $PbEu_{0.8}Te_{0.2}$ and n layers of PbTe, where m and n are preferably between 10 and 2000. However, the invention is not so limited. Other combinations and amounts of similar materials may be used. According to a preferred embodiment, MBE may be used to grow PbEuTe and PbTe on (111) barium fluoride ($BaF_2$) substrates at substrate temperatures in the range of 100° to 250° C.

In accordance with a further aspect of the present invention, a superlattice structure for a thermoelectric element used for thermoelectric power generation, includes a plurality of epitaxially grown alternating layers of materials A and B, where materials A and B are substantially lattice matched in a direction perpendicular to the direction of growth and are formed from materials which provide a thermoelectric figure of merit greater than 1.7 and which increases with increasing temperature. With this particular arrangement, a superlattice structure having thermo-electric figure of merit which increases to a value greater than achievable with bulk materials is provided. In one particular embodiment, each layer formed from material A corresponds to a barrier layer comprising $Pb_{1-y}Eu_yTe$ wherein $0 \leq y \leq 1$ and each layer formed from material B corresponds to a quantum well layer comprising PbTe. The alternating layers of materials A and B are epitaxially grown over a buffer layer. In one embodiment, the buffer layer includes $Pb_{1-y}Eu_yTe$ wherein $0 \leq y \leq 1$. The superlattice and buffer layers may be grown, deposited or otherwise disposed over a substrate provided from $BaF_2$. The structures disclosed herein indicate an enhanced ZT at 300 K in thermoelectric quantum wells, which is believed to be a result of the large density-of-states per unit volume increase that occurs for small well widths in a quasi-2D geometry. Measured Seebeck coefficients at a temperature of about 300 K of $Pb_{0.927}Eu_{0.073}Te/PbTe$ MQW samples with near-optimum carrier concentrations are about two times larger than those of high-quality bulk PbTe for quantum-well widths in the 17 to 23 Å range. The 300 K electron mobility of a sample with a well width of 19 Å is 15 to 20% higher than lower-doped single-layer MBE-grown PbTe layers, which indicates the effectiveness of modulation doping utilized in the sample. The combined enhancements of the Seebeck coefficient and mobility resulted in an increase in the 300 K ZT of PbTe from ~0.45 for bulk material to greater than 1.2 in quantum wells.

BRIEF DESCRIPTION OF THE DRAWINGS

The foregoing features of this invention as well as the invention itself may be more fully understood from the following detailed description of the drawings in which.

DESCRIPTION OF THE PREFERRED EMBODIMENTS

Figures 1, 1A:
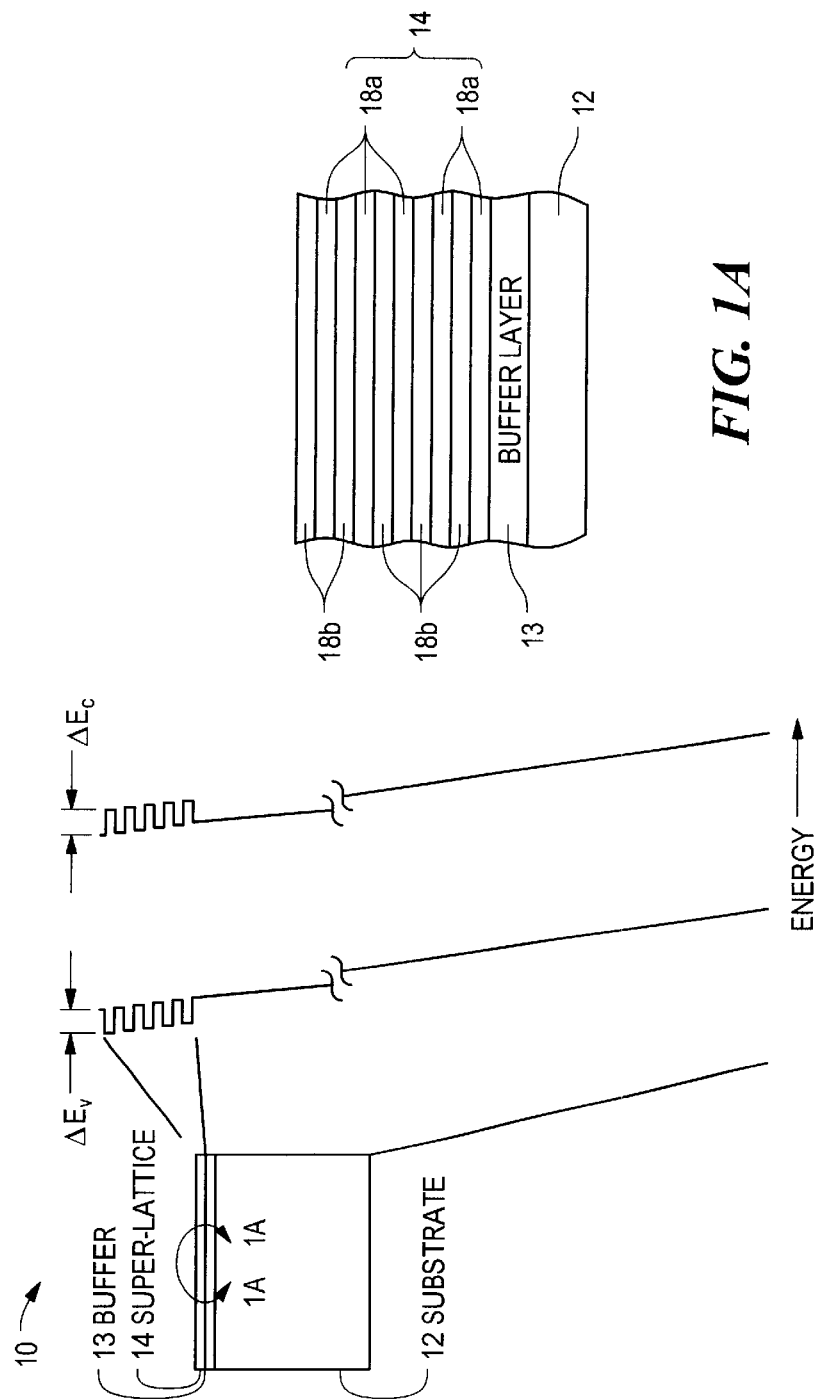
FIG. 1 is a graphical representation of a thermoelectric material and an associated energy band.
FIG. 1A is a blown-up view of a portion of FIG. 1 showing in detail the structure of the superlattice layer.

Referring now to FIGS. 1 and 1A, a thermoelectric device 10 is shown formed on a substrate 12 comprising barium fluoride ($BaF_2$) or other suitable material having disposed on a first surface thereof a buffer layer 13. Disposed over buffer layer 13 is a super-lattice layer 14 provided from alternating layers of PbEuTe and PbTe which is epitaxially grown. Substrate 12 may be provided as 111 or cleaved $BaF_2$ having a thickness typically in the range of 0.5–1.0 mm. Alternatively substrate 12 may be provided as 110 $BaF_2$ or as potassium chloride (KCl). It is preferable for the substrate 12 to be provided from an insulating material which is nearly lattice matched to superlattice layer 14 (e.g. nearly lattice matched to PbTe) and has a coefficient of thermal expansion which is relatively close to that of the superlattice 14.

Insulators are preferred since they contribute nothing or an insignificant amount to the Seebeck coefficient S or to the conductivity.

The substrate is provided having a thickness which is as thin as possible, yet which provides good mechanical support. When measuring the Seebeck coefficient and electrical conductivity characteristics of the superlattice 14 the superlattice remains on the substrate. When measuring the thermal conductivity, the superlattice is removed from the substrate. When utilized in practical applications, however, the super-lattice 14 is removed from the substrate 12.

The superlattice may be provided having an overall thickness typically of in the range of about 6 microns to about 25 microns and may include in the range of about 100–2000 periods. In one embodiment, super-lattice 14 may be provided from PbTe doped with an n-type dopant and provided from 20 angstrom quantum well layers and 460 angstrom barrier layers. Other embodiments are also possible. For example, p-type PbTe having 20 angstrom wells and 220 angstrom barriers may also be used. In this case the thickness may be computed as 100 (20+220) angstroms.

Super-lattice 14 is provided having a minimum thickness such that the quantum well is more than a couple of lattice constants. This is because smaller thicknesses may not exhibit properties of the semiconductor in the quantum well. Also, super-lattice 14 is provided having a maximum thickness such that the quantum well width is small enough to exhibit properties of a two-dimensional electron gas. For PbTe this would be less than 40 angstroms. For silicon (Si) the maximum thickness is believed to be less than about 70 angstroms.

Referring now to FIG. 1A, the superlattice layer 14 is shown to comprise a plurality of alternating layers 18a, 18b. More particularly, for the superlattice 14 shown in FIG. 3 for a superlattice comprising PbTe, the periods 18a comprise regions of lead europium telluride ($Pb_xEu_{1-x}Te$) having a composition ratio x of lead to europium of about at least 0.1 to 1.0. Preferably x is in the range of 0.3 to 0.5. Disposed between the layers of PbEuTe are layers of PbTe 18b. This arrangement provides a superlattice heterostructure comprising alternating periods of lead europium telluride and lead telluride preferably each having a thickness typically in the range of 10 A to 500 A with 20 A being a typical preferred thickness.

Preferably the alternating layers 18a, 18b are disposed over the substrate 12 and buffer layer 13 by molecular beam epitaxy. This deposition technique is preferable because it allows for relatively thin layers of uniform thickness to be deposited and in particular because of the necessity of using differences in band gap energies it allows the layers to be deposited with abrupt interfaces between the alternating layers thus preventing significant interdiffusion or alloying of the superlattice structure.

It should be noted that preferably there exists a relatively smooth interface between the quantum well and barrier layers. For example, the interface is preferably not more than 2–3 atom layers of roughness. It should also be noted that the layers should be provide having a thickness which is thin enough to get confinement of carriers at least in part to the well layer. Preferably a substantial number of carriers are confined to the well layers as opposed to the barrier layers although it should be appreciated that some carriers may exist in the barrier layers.

Figure 2:
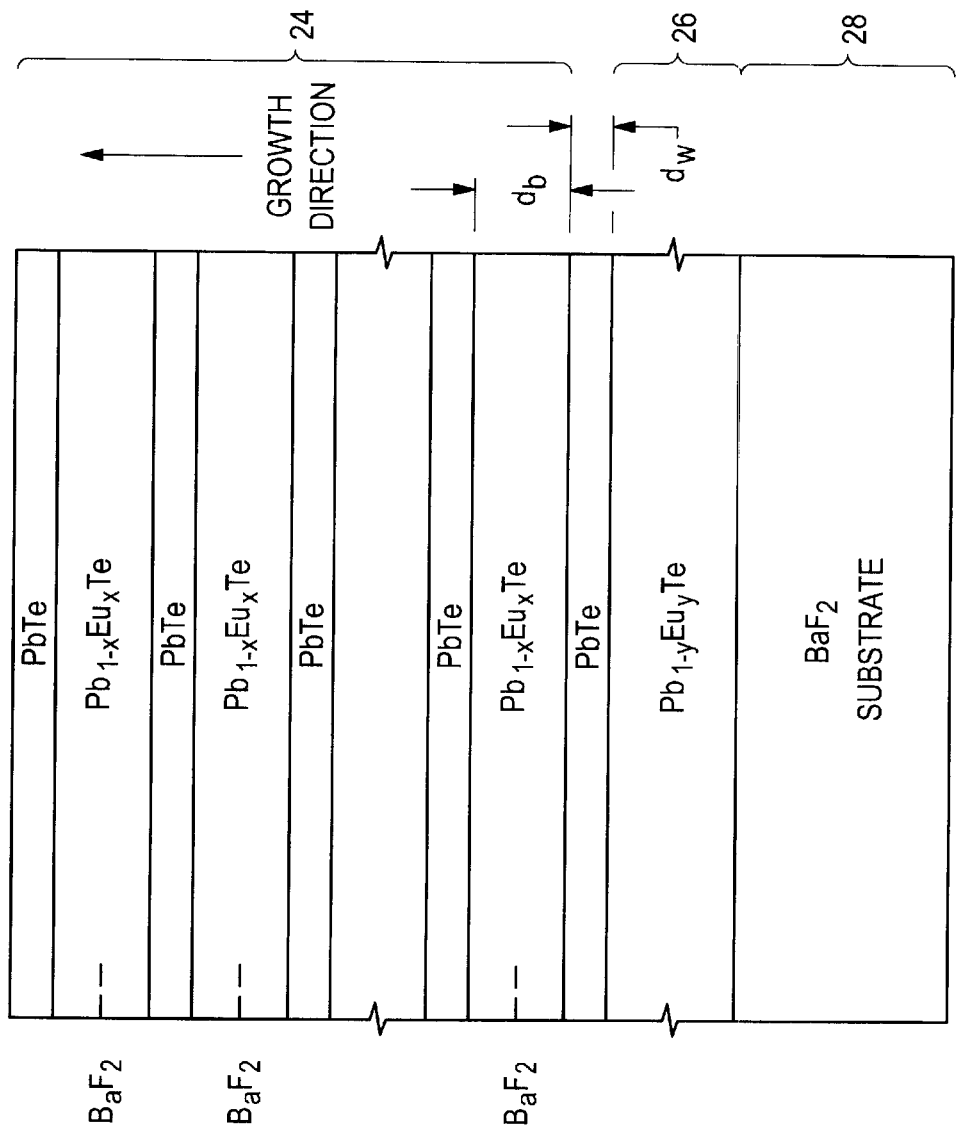
FIG. 2 is a diagrammatical cross-sectional view of a PbEu-chalcogenide multiple quantum-well structure.

Referring now to FIG. 2, a superlattice 24 provided from a plurality of alternating layers of PbTe having a thickness $d_w$ and PbEuTe having a thickness of $d_b$ is disposed over a PbEuTe buffer layer 26 which is in turn disposed over a $BaF_2$ substrate 28. In one particular embodiment, the layers of PbEuTe are provided having a composition ratio of $Pb_{1-x}Eu_xTe$ where x is in the range of 0.04 to 0.1. In one particular embodiment, the layers of $Pb_{1-x}Eu_xTe/PbTe$ layers are provided as $Pb_{0.927}Eu_{0.073}Te/PbTe$ multiple quantum well (MQW) structures disposed over a $Pb_{0.958}Eu_{0.042}Te$ buffer layer 26 and the $BaF_2$ substrate 28.

The superlattice 24 is doped with a planar or δ-dopant of $BaF_2$ for doping the quantum wells of the superlattice as p-type in the range of $10^{19}$ cm$^{-3}$ to $10^{21}$ cm$^{-3}$. The buffer layer 26 is provided having a thickness which is relatively small in the range of 500 to 2000 Å such that the electrical conductance of the buffer layer 26 is negligible relative to the conductance of the MQW 24. Further, the maximum range of the buffer layer thickness is such that the effect of the buffer layer on the superlattice thermoelectric properties is negligible.

The characteristics of a barrier material for a good quantum-well thermoelectric superlattice can be summarized as follows: (a) nearly matched-lattice parameters and thermal expansion coefficients to the well material; (b) an energy band-gap and barrier thickness sufficiently large to confine all the conduction electrons to the quantum well; (c) does not degrade significantly the carrier mobility or Seebeck coefficient of the well material; and (d) has a low lattice thermal conductance.

By using relatively thin PbTe quantum wells (e.g. quantum wells 19–20 Å in thickness) $Pb_{0.927}Eu_{0.073}Te$ barriers having a thickness of approximately 400 Å thick satisfy the first three of these criteria.

The PbEu-chalcogenide material system is well suited for investigating thermoelectric properties of quantum wells, because it is both a good thermoelectric material and has a good epitaxial growth technology base. PbTe and the Pb-salt alloys are among the best bulk thermoelectric materials in the temperature range of about 500 K to about 700 K. Epitaxial growth of Pb-salt alloys has been the subject of numerous investigations primarily carried out for infrared diode laser applications. The growth of $Pb_{1-x}Eu_xTe/PbTe$ multiple-quantum-well (MQW) structures by molecular beam epitaxy (MBE) has been studied extensively, and superlattice satellite reflections from such structures up to the order of eight have been observed using triple-axis x-ray diffraction (XRD). These XRD results indicate the following: (a) reproducibility of the thicknesses of the superlattice sublayers; and (b) high-quality, abrupt interfaces between the barrier and well sublayers, i.e., minimal interdiffusion between the well and barrier materials.

Investigations of the electrical and optical properties have shown that $Pb_{1-x}Eu_xTe/PbTe$ MQWs with x=0.047 the electrical conduction at 77 K and below is confined to the quantum wells for low concentration (~$10^{16}$ cm$^{-3}$) undoped material.

In accordance with the present invention $Pb_{1-x}Eu_xTe/PbTe$ MQW structures grown by MBE on $BaF_2$ substrates and having enhanced thermoelectric properties are disclosed. Such unexpectedly enhanced thermoelectric properties are believed due to the effect of increased density-of-states per unit volume.

In $PbTe/Pb_{1-x}Eu_xTe$ systems, the PbTe is the quantum well and $PbTe/Pb_{1-x}Eu_xTe$ is the barrier material. Such structures have a type-I band alignment and a nearly symmetric offset between valence and conduction bands. The energy gap of the $Pb_{1-x}Eu_xTe$ barrier increases strongly with x, the Eu content, so only about 6% Eu can give large confinement energies and yield 2D transport for electrons in the PbTe quantum wells. The mobility of $Pb_{1-x}Eu_xTe$ also decreases rapidly with increasing Eu content.

The manner in which samples were prepared and measured is explained in detail below. Briefly, however, in one embodiment to generate n-type material, first a $Pb_{0.958}Eu_{0.042}Te$ buffer of about 2000 Å was deposited on a freshly cleaved $BaF_2(111)$ substrate. Next, superlattice samples with 100 to 150 periods of $PbTe/Pb_{0.927}Eu_{0.073}Te$ MQW structures were grown, with PbTe well widths varying between 17 and 55 Å, separated by wide $Pb_{0.927}Eu_{0.073}Te$ barriers of about 450 Å. The carrier density was varied by using Bi donor atoms in the barrier material. This resulted in an n-type material so that essentially all the electrical conduction is in the conduction-band quantum well. P-type materials were similarly prepared with appropriate changes in doping to provide the p-type material.

In one embodiment, the $Pb_{1-x}Eu_xTe/PbTe$ MQW structures of the present invention were grown utilizing a modified 360-type Varian growth chamber with an associated custom-built load-lock chamber. For the growth, 1.8×1.8 cm cleaved, as-received $BaF_2$ (111) substrates with thicknesses of approximately 1 mm were degreased prior to loading in the load-lock chamber. The substrates were thermally cleaned in the MBE system at 490° C. for 32 min. The substrate temperatures were 350° C. for buffer layer growth and 300° C. for the MQW growth. In situ reflection high-energy electron diffraction (RHEED) surface studies were performed during growth with an electron gun operated at 15 keV. Initially, RHEED spots were observed on the screen but were completely changed to streaks after 2 min of buffer layer growth, which indicated a change in epitaxial growth morphology from three-dimensional (3D) islands to 2D layer-by-layer growth and a smooth surface for subsequent MQW structure growth.

Buffer layer growth was then continued an additional 8 min for a total thickness in the range 1100 to 1900 Å. Since the accuracy of the measured thermoelectric properties improves with film thickness, relatively thick MQW structures in the range 4.5 to 6 μm were grown with the number of periods typically equal to 120. Growth rates were in the range of 0.75 to 1.0 μm/h. Effusion cells containing Eu, zone-refined PbTe, and $Te_2$ were used in growing the undoped $Pb_{0.958}Eu_{0.042}Te$ buffer layers. Only one effusion cell containing zone-refined PbTe was used for the quantum-well growth, but four effusion cells were used for the Bi-doped $Pb_{0.927}Eu_{0.073}Te$ barriers, i.e., PbTe, Eu, $Te_2$, and Bi. The beam fluxes from the different effusion cells were measured with an ion gauge beam flux monitor. The background pressure in the growth chamber during growth and usually kept in the $10^{-10}$ Torr range.

The substrate temperature was measured with a thermocouple in which the molybdenum substrate block becomes part of the thermocouple circuit. There was no indication of any deterioration in MQW crystal structure quality with growth time, i.e., good-quality RHEED streaks were observed throughout the growth of the MQWs with no sign of spotty streaks, which indicates high-quality 2D growth for the entire structure.

As discussed above, thin undoped buffer layers 26 were used so that the electrical conductance of the buffer layer 26 would be negligible relative to the conductance of the approximately 100 quantum wells in each film. The thickness of the PbTe quantum well $d_w$ and the $Pb_{0.927}Eu_{0.073}Te$ barrier layer $d_b$ were varied by computer programmed shutter times.

THERMOELECTRIC PROPERTIES

Bulk Material

The thermoelectric figure of merit is given by $$ZT = S^2 \sigma T/\kappa = P_F T/\kappa \qquad (1)$$

where S, σ, κ, T, and $P_F$ (=$S^2\sigma$) are the Seebeck coefficient, the electrical conductivity, the thermal conductivity, the temperature, and the power factor, respectively. Since the highest possible ZT is sought for energy conversion applications, a high $P_F$ and a low κ are needed. For single layers and bulk PbTe, Eq. (1) can also be written as $$ZT = S^2 n e \mu T/(\kappa_l \text{ and } \kappa_e) \qquad (2)$$

where n, e, μ, $\kappa_l$ and $\kappa_e$ are the carrier density, electronic charge, carrier mobility, and the lattice and electronic parts of the thermal conductivity, respectively. Equation (1) can be written $$ZT = S^2 GT/K \qquad (3)$$

where G and K are the electrical and thermal conductances, respectively.

Layered Material

The electrical conductance and Seebeck coefficients of the MQW structures were measured with the temperature gradient and electric field applied parallel to the epilayer interfaces. Reported theoretical calculations indicate that parallel electrical conduction along the barrier layers is negligible compared to that along the quantum-well layers for the MQW structures used in the experiments reported here. Also, the electric conductance of the thin, undoped, low carrier $Pb_{0.958}Eu_{0.042}Te$ buffer layer was negligible, i.e., 5.3 mho/cm. In the following 2D analysis, it is assumed that the electrical current flows only through the quantum wells, i.e., the barriers are considered electrical insulators. Consequently, the electrical conductance of the sample is given by $$G_{2D} = \sigma_w t_w W/L \qquad (4)$$

where σ is the electrical conductivity of the quantum wells, L is the sample length, W is the sample width, and $t^w$ is the sum total thickness of all the quantum wells, i.e., $t_w \Sigma d_w$ or the product of $d_w$ and the number of periods. The 2D power factor is $$P_{F2D} = S^2 \sigma_w = S^2 n_w e \mu \qquad (5)$$

when $n_w$ is the carrier density of the quantum wells.

To complete the analysis, it is further assumed that the heat flows only through the quantum wells (i.e., the barriers are considered ideal thermal insulators) by definition of 2D and so the 2D thermal conductance is given by $$K_{2D} = (\kappa_l^w + \kappa_e^w) t_w W/L \qquad (6)$$

where $\kappa_l^w$ and $\kappa_e^w$ are the lattice and electronic parts of the thermal conductivity of the quantum wells. The assumption of Eq. (6) concerning the additivity of $\kappa_l^w$ and $\kappa_e^w$ is widely used for thermoelectric materials and leads to results, which are in good agreement with experiment, because one-band bulk materials give the best ZT values. Thus, the ambipolar contribution to the thermal conductivity is negligible. It is clear from the data to be presented that the thermal conductance along the barriers is much greater than the thermal conductance along the quantum wells.

The electronic part of the thermal conductivity in Eq. (6) is determined from the Wiedemann-Franz law as $$\kappa_e^w = L_o \sigma_w \quad (7)$$

where $L_o$ is a parameter, which is dependent on the electron scattering mechanism and the statistics. The value used for $L_o$ for this investigation was $4.4 \times 10^{-6}$ ohm-W/K. The value used for $\kappa_l^w$ was 20 mW/cm-K. Using Eq. (3) through Eq. (6), the 2D thermoelectric figure of merit for the quantum wells of a MQW structure may be computed as shown in Equation (8).

$$ZT_{2D}T = S^2 n_w e \mu T / (\kappa_l^w + \kappa_e^w) \quad (8)$$

Values of S $n_w$, and $\mu$ have been measured for numerous MBE-grown $Pb_{0.927}Eu_{0.073}Te/PbTe$ MQW samples and the key results of these measurements are presented in detail below.

CHARACTERIZATION

Measurements of the Hall coefficient $R_H$ at 0.5 Tesla and the electrical conductivity of the various samples were made at room temperature and 77 K by the van der Pauw method using conventional dc techniques and soldered (Bi-In-Pb-Sn eutectic) contacts. The Hall coefficient is calculated from the Hall voltage, electrical current, magnetic field, and the thickness. Here, a Hall coefficient for the quantum wells $R_{H2D}$ was calculated using $t_w$ instead of the total thickness of the epilayers, which assumes only the wells contribute. The carrier mobility $\mu$ and the carrier concentration $n_w$ were obtained by using the one-carrier expressions $n_w = 1/R_{H2D}e$ and $\mu = R_{H2D} \sigma_w$, respectively.

Seebeck coefficients were measured at room temperature by placing a cleaved film-substrate composite between the flat ends of two 0.25 in. diam copper rods, one cooled with a commercial ice-point reference standard and the other wrapped with insulated resistance wire and joule heated. The temperature gradient across the film was varied from about 1 to 10° C./cm by varying the current through the resistance wire. Tiny 40-gauge chromel/alumel thermocouples were soldered directly on the film surface near the warm and cold ends of the copper rods. Temperature differences in the 3 to 6° C. range were typically imposed between the two thermocouples, which were separated by approximately 6 mm of film surface. The Seebeck coefficients were determined from the thermally generated voltages across various combinations of thermocouple wires. The voltages were measured using a precision multimeter.

The total thickness of the epilayers was determined by measuring the thickness of a cleaved cross section of the film-$BaF_2$ substrate composite with an optical microscope at 1320× magnification. The thicknesses of the quantum wells, barriers, and buffer layer were determined from this measurement and the respective growth times and growth rates. Uncertainty in these thickness measurements was about ±5%, which was the major source of measurement uncertainty in determining thermoelectric parameters.

The Eu contents of the barrier and buffer layers were determined using XRD data. Single layers of $Pb_{1-x}Eu_xTe$ were grown by MBE for calibration and XRD spectra recorded using the (444) lines of both $Pb_{1-x}Eu_xTe$ and the $BaF_2$ substrate in the analysis.

The (444) Bragg angle data for both $Pb_{1-x}Eu_xTe$ and $BaF_2$ used herein were normalized to the accepted literature value for the (444) Bragg angle of $BaF_2$ (6.200 Å lattice constant) in order to obtain the lattice constant of a specific composition of $Pb_{1-x}Eu_xTe$. An equation relating mole fraction of EuTe to lattice constant was used to calculate the mole fraction of EuTe in the $Pb_{1-x}Eu_xTe$ single-layer sample. The Eu-to-PbTe flux ratio vs x data obtained in the calibration layer growths were then used to adjust the buffer and barrier layer compositions to the desired compositions during the MQW growth.

Numerous $Pb_{1-x}Eu_xTe/PbTe$ MQW samples were grown with PbTe well widths in the range 10 to 50 Å and $Pb_{1-x}Eu_xTe$ barrier widths in the 300 to 600 Å range. Samples with x=0.042 exhibited a large decrease in electron mobility with increasing barrier width, indicative of 3D conduction. For the case of 26 Å wells and 1300 Å barriers, the 300 K carrier mobility for an average (well and barrier) carrier density of ~$10^{17}$ cm$^{-3}$ was only 240 cm$^2$/V-s, which is very close to the electron mobility of $Pb_{0.958}Eu_{0.042}Te$.

For $Pb_{0.927}Eu_{0.073}Te/PbTe$ MQW samples, high electron mobilities at large barrier thickness were found, which confirmed expectations of 2D conduction for these wide barriers. To investigate the theoretical predictions, various $Pb_{0.927}Eu_{0.073}Te/PbTe$ MQW samples were grown with PbTe well widths in the 15 to 50 Å range and $Pb_{0.927}Eu_{0.073}Te$ barrier widths in the 360 to 540 Å range. The Eu content in the barriers was kept at x=0.073±0.004, which gives a difference in band gap between the PbTe wells and the $Pb_{0.927}Eu_{0.073}Te$ barriers of about 0.4 eV at 300 K.

Published works agree that a Type-I band alignment occurs for a $Pb_{1-x}Eu_xTe/PbTe$ superlattice in the range of compositions of x smaller than 0.10. Since for x<0.05, the band offsets are nearly symmetric, it would be expected for x=0.073 that the conduction band offset or barrier height is approximately 0.2 eV. Modulation-doped $Pb_{0.953}Eu_{0.047}Te/PbTe$ MQW samples with very wide barrier layers and low carrier concentrations have been shown to exhibit enhanced carrier mobilities at 77 K because of the spatial separation of electrons from their donors. In modulation doping, only the wide-gap barrier layer material is doped leaving the PbTe quantum-well layer relatively free of impurities. Electrons are transferred laterally from the donor states of the higher-lying conduction band edge of the $Pb_{0.927}Eu_{0.073}Te$ barriers to the lower conduction band states in the PbTe well layer. Thus, a spatial separation of electrons from the impurities occurs. All of the MQW samples were modulation doped with Bi.

Experimental results of the samples (including carrier concentrations, carrier mobilities, Seebeck coefficients, and thermoelectric power factors) are summarized in Tables 2 through 4.

Properties of selected high-quality bulk n-type Pb/Te samples are listed below in Table 1.

TABLE 1

Thermoelectric Properties of High-Quality Bulk PbTe Samples

| Sample No. | 300 K Seebeck Coefficient S ($\mu$V/K) | 300 K Power Factor ($\mu$W/cm-K$^2$) | Carrier Concentration n (cm$^{-3}$) 300 K | 77 K | Carrier Mobility $\mu$ (cm$^2$/V-s) 300 K | 77 K |
|---|---|---|---|---|---|---|
| Z-7    | −498 | 6.0  | $1.0 \times 10^{17}$ | $9.2 \times 10^{16}$ | 1500 | 38000 |
| 5-68   | −434 | 8.2  | $1.9 \times 10^{17}$ | $1.8 \times 10^{17}$ | 1400 | 37000 |
| 3-68H  | −412 | 11.6 | $2.9 \times 10^{17}$ | $2.8 \times 10^{17}$ | 1500 | 38000 |
| 3-68J  | −375 | 13.0 | $3.6 \times 10^{17}$ | $3.5 \times 10^{17}$ | 1600 | 38000 |
| 3-68E  | −378 | 11.8 | $3.7 \times 10^{17}$ | $4.0 \times 10^{17}$ | 1400 | 29000 |
| 3-68G  | −368 | 15.3 | $4.4 \times 10^{17}$ | $4.3 \times 10^{17}$ | 1600 | 38000 |
| 3-68K  | −343 | 17.5 | $5.8 \times 10^{17}$ | $5.4 \times 10^{17}$ | 1600 | 38000 |
| 2-18   | −322 | 18.9 | $6.7 \times 10^{17}$ | $6.8 \times 10^{17}$ | 1700 | 37000 |
| 3-68F  | −320 | 17.2 | $7.5 \times 10^{17}$ | $7.6 \times 10^{17}$ | 1400 | 29500 |
| 3-68L  | −302 | 20.5 | $8.8 \times 10^{17}$ | $8.0 \times 10^{17}$ | 1600 | 35000 |
| 3-68B  | −304 | 21.1 | $9.5 \times 10^{17}$ | $9.4 \times 10^{17}$ | 1500 | 33000 |
| 3-68I  | −300 | 22.3 | $9.7 \times 10^{17}$ | $8.5 \times 10^{17}$ | 1600 | 37000 |
| 3-68A  | −284 | 19.2 | $9.9 \times 10^{17}$ | $9.3 \times 10^{17}$ | 1500 | 35000 |
| 3-68D  | −251 | 24.8 | $1.4 \times 10^{18}$ | $1.5 \times 10^{18}$ | 1700 | 31000 |
| 1-72   | −235 | 24.7 | $2.0 \times 10^{18}$ | $2.0 \times 10^{18}$ | 1400 | 20000 |
| 4-73B  | −96  | 24.8 | $1.4 \times 10^{19}$ | $1.6 \times 10^{19}$ | 1200 | 6900  |
| 4-73A  | −77  | 19.9 | $2.1 \times 10^{19}$ | $2.4 \times 10^{19}$ | 1000 | 4900  |
| 12-73  | −54  | 15.7 | $2.8 \times 10^{19}$ | $3.3 \times 10^{19}$ | 1200 | 6000  |
| 20-73B | −26  | 4.1  | $3.8 \times 10^{19}$ | $4.6 \times 10^{19}$ | 1000 | 4600  |
| 20-73A | −25  | 3.7  | $3.9 \times 10^{19}$ | $4.6 \times 10^{19}$ | 940  | 5000  |

Figure 3:
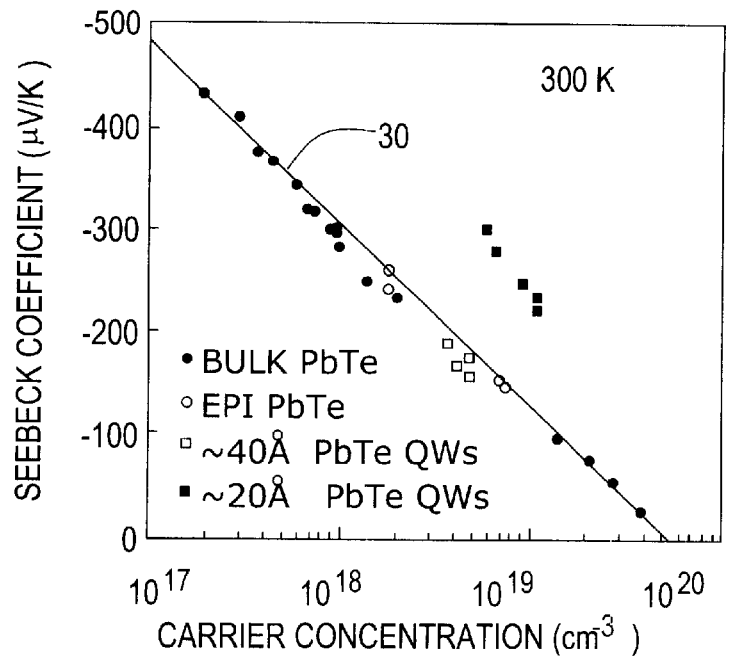
FIG. 3 is a plot of Seebeck coefficient vs. carrier concentration for n-type bulk PbTe, epitaxial PbTe and $Pb_{0.927}Eu_{0.073}Te/PbTe$ quantum wells.

The materials had been prepared from semiconductor-grade Pb and Te and grown by the Bridgman method. The samples were polycrystalline with large-grain sizes. The low concentration samples were undoped whereas the higher concentration samples were doped with various impurities such as Bi and Cl. Seebeck coefficients at 300 K varied from −498 $\mu$V/K at low carrier concentrations to −25 $\mu$V/K at the highest concentration. At lower carrier concentrations, the average 300 K carrier mobility was 1600 cm$^2$/V-s which decreases to 940 cm$^2$/V-s at a carrier concentration of $3.9 \times 10^{19}$ cm$^{-3}$. FIG. 3 shows a semilog plot of these S vs n data for bulk PbTe, which are fit by a straight line given by the simple expression $$S(\mu V/K) = -477 + 175 \log_{10}(n/10^{17} \text{ cm}^{-3}) \quad (9)$$

From this expression and the slow mobility change with carrier concentration, a maximum power factor of 38 $\mu$W/cm-K$^2$ at about $6 \times 10^{18}$ cm$^{-3}$ is computed which is consistent with the best reported values for PbTe. Using $\kappa_l = 20$ mW/cm-K, the maximum value of ZT may be computed to be $ZT_{max} = 0.45$.

Table 2 is a list of the geometrical parameters of the various MQW samples.

TABLE 2

Parameters of Pb$_{0.927}$Eu$_{0.073}$Te/PbTe MQW Structures

| Sample No. | Total Sample Thickness ($\mu$m) | Thickness of Pb$_{0.958}$Eu$_{0.042}$Te Buffer (Å) | Thickness of Pb$_{0.927}$Eu$_{0.073}$Te Buffer $d_b$ (Å) | Thickness of PbTe Well $d_w$ (Å) | Number of Periods* |
|---|---|---|---|---|---|
| T-225 | 5.2 | 1400 | 410 | 19   | 120 |
| T-229 | 4.9 | 1500 | 430 | 20   | 106 |
| T-235 | 6.1 | 1700 | 480 | 23   | 120 |
| T-246 | 4.3 | 1200 | 330 | 15.5 | 120 |
| T-236 | 6.1 | 1700 | 480 | 23   | 120 |
| T-218 | 6.2 | 1700 | 480 | 45   | 114 |
| T-222 | 6.7 | 1900 | 540 | 34   | 118 |
| T-215 | 5.6 | 1500 | 440 | 41   | 114 |
| T-208 | 2.6 | 1100 | 420 | 40   | 54  |

*The total number of periods corresponds to the number of computer timing loop sequences and is tabulated by the computer.

A comparison of the room-temperature electron mobilities given in Tables 1 and 2 shows that single-layer PbTe films have somewhat lower electron mobilities than high-quality bulk PbTe. This is presumably a result of unoptimized growth. Of particular note is the very high mobility (1420 cm$^2$/V-s) found in MQW sample T-225. This mobility is higher than that of single-layer PbTe films despite the larger carrier concentration and is at least equal to the mobility for the best bulk PbTe samples. That this is achieved when the MQW film is composed mostly (95%) of very low mobility (45 cm$^2$/V-s at 300 K), Pb$_{0.927}$Eu$_{0.073}$Te material is strong evidence that pure 2D conduction is occurring and that modulation doping can be effective in these Pb$_{0.927}$Eu$_{0.073}$Te/PbTe MQW samples with nearly optimized growth conditions. There has been no focused effort applied to optimization of the epitaxial growth or the reproducibility of the best result. There is a wide variation in the carrier mobility from the best sample to the worst and it is believed that mobility is quite sensitive to the growth variables such as effusion cell flux ratios. In general, $Pb_{0.927}Eu_{0.073}Te/PbTe$ MQW films have somewhat lower electron mobilities than the single-layer PbTe films, although 20× higher than that of the $Pb_{0.927}Eu_{0.073}Te$ barrier material.

The Seebeck coefficient values of PbTe epilayers are equivalent to values of the bulk PbTe and can be used to fill in the data gap in FIG. 3 near a carrier concentration of $6 \times 10^{18}$ cm$^{-3}$. For the best PbTe epilayer identified as sample T-184, using $\kappa_l = 20$ mW/cm-K, a figure of merit ZT equal to 0.37 is computed which is a value comparable to the best reported bulk PbTe value at room temperature.

Referring now to FIG. 3, a plot of the Seebeck coefficient values of the MQW films listed in Table 2 are shown. As can be seen from FIG. 3, the plot shows a decrease with increasing carrier concentration similar to that of bulk material. In the calculations of $Z_{2D}T$, carrier mobility and thermal conductivity in the quantum wells were assumed equal to bulk values and independent of well thickness. Thus, from Equation (8), it was necessary to only examine $S^2 n$, and since S varies with n, it is possible to compare quantum-well S values with bulk values near the optimum carrier concentration (~$6 \times 10^{18}$ cm$^{-3}$). It should be noted that the samples with ~40 Å well widths have S values very close to the bulk curve. As the well width was decreased S increased, and at well widths near 20 Å, the samples were found to have Seebeck coefficients having values about two times higher than those obtained from high-quality bulk material. This rapid increase with decreasing well width is in agreement with the calculations. Well widths thinner than 17 Å did not result in further improvements, possibly because of interface effects. The thickness of these thin wells corresponds to only four to six atom layers or two to three molecular layers.

Tables 3 and 4 show the thermoelectric properties of MBE-grown Pb-salt samples and $Pb_{0.927}Eu_{0.073}Te/PbTe$ MQW samples at a temperature of 300 K, respectively.

TABLE 3

Thermoelectric Properties of MBE-Grown Pb-salt samples

| Sample No. | 300 K Seebeck Coefficient S ($\mu$V/K) | 300 K Power Factor ($\mu$W/cm-K$^2$) | Carrier Concentration n (cm$^{-3}$) | | Carrier Mobility $\mu$ (cm$^2$/V-s) | |
|---|---|---|---|---|---|---|
| | | | 300 K | 77 K | 300 K | 77 K |
| A. Bi-doped PbTe Single-layer Samples | | | n | | $\mu$ | |
| T-141 | −259 | 22 | $1.8 \times 10^{18}$ | $1.6 \times 10^{18}$ | 1120 | 21900 |
| T-142 | −242 | 20 | $1.8 \times 10^{18}$ | $1.5 \times 10^{18}$ | 959 | 19100 |
| T-164 | −150 | 31 | $7.0 \times 10^{18}$ | $6.2 \times 10^{18}$ | 1230 | 14400 |
| T-184 | −149 | 32 | $7.4 \times 10^{18}$ | $7.2 \times 10^{18}$ | 1220 | 13000 |
| B. Undoped $Pb_{0.927}Eu_{0.073}Te/PbTe$ Single-layer Sample | | | | | | |
| T-183 | −288 | 0.4 | $0.32 \times 10^{18}$ | $0.29 \times 10^{18}$ | 45 | 95 |
| C. $Pb_{0.927}Eu_{0.073}Te/PbTe$ MQW Samples | | | $n_w$ | | | |
| T-225 | −225 | — | $1.1 \times 10^{19}$ | n.m | 1420 | n.m |
| T-229 | −235 | — | $1.1 \times 10^{19}$ | n.m | 710 | n.m |
| T-235 | −303 | — | $5.9 \times 10^{18}$ | n.m | 650 | n.m |
| T-246 | −222 | — | $7.5 \times 10^{18}$ | n.m | 1050 | n.m |
| T-236 | −282 | — | $6.7 \times 10^{18}$ | $6.9 \times 10^{18}$ | 640 | 5600 |
| T-218 | −174 | — | $4.8 \times 10^{18}$ | n.m | 950 | n.m |
| T-222 | −166 | — | $4.8 \times 10^{18}$ | n.m | 890 | n.m |
| T-215 | −157 | — | $5.1 \times 10^{18}$ | n.m | 850 | n.m |
| T-208 | −188 | — | $3.7 \times 10^{18}$ | $3.7 \times 10^{18}$ | 800 | 8800 |

TABLE 4

Thermoelectric Properties of $Pb_{0.927}Eu_{0.073}Te/PbTe$ MQW Samples at 300 K

| Sample No. | Seebeck Coefficient Ratio | 2D Power Factor $P_{F2D}$ ($\mu$W/cm-K$^2$) | Electrical Conductivity $\sigma_w$ (mho/cm) | Thermoelectric Figure of Merit* Wells Only $Z_{2d}T$ |
|---|---|---|---|---|
| T-225 | 1.88 | 130 | 2500 | 1.23 |
| T-229 | 1.96 | 66 | 1200 | 0.78 |
| T-235 | 1.81 | 55 | 600 | 0.73 |
| T-246 | 1.49 | 62 | 1260 | 0.72 |
| T-236 | 1.79 | 54 | 680 | 0.71 |
| T-218 | 0.95 | 22 | 730 | 0.29 |
| T-222 | 0.91 | 19 | 680 | 0.24 |
| T-215 | 0.88 | 17 | 690 | 0.22 |
| T-208 | 0.93 | 17 | 480 | 0.23 |

*Bulk PbTe lattice thermal conductivity $\kappa$ value of 20 mW/cm-K.

The 2D figures of merit for the PbTe quantum wells shown in Table IV were calculated using Eq. (7) and Eq. (8). For all five narrow-quantum-well samples, $Z_{2D}$ exceeded the expected $ZT_{max}=0.45$ of bulk PbTe. For sample T-225, the combined enhancement of the Seebeck coefficient and mobility resulted in $Z_{2D}T=1.23$, a result which breaks the decades-old $ZT \cong 1.0$ barrier for thermoelectric materials at 300 K.

Figure 4:
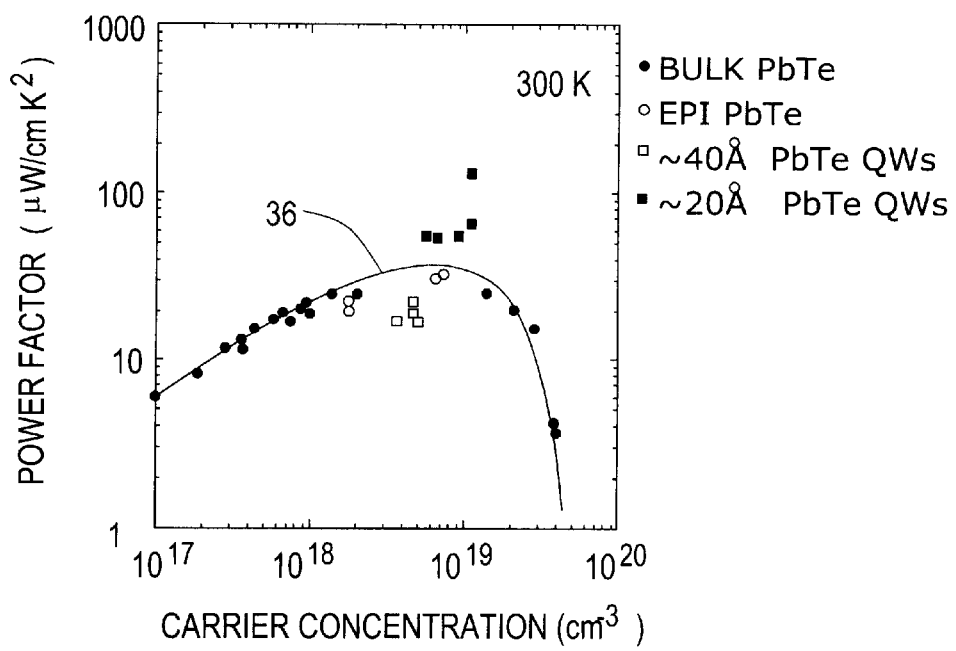
FIG. 4 is a plot of thermoelectric power factor vs. carrier concentration for n-type bulk PbTe, epitaxial PbTe and $Pb_{0.927}Eu_{0.073}Te/PbTe$ quantum wells.

Referring now to FIG. 4, a plot of thermoelectric power factor vs. carrier concentration for n-type bulk PbTe, epitaxial PbTe and $Pb_{0.927}Eu_{0.073}Te/PbTe$ quantum wells is shown. The power factors ($S^2\sigma$ and $S_2\sigma_w$) from Tables 1, 3, and 4 are plotted as a function of the carrier concentration at a temperature of 300 K. A curve 36 was calculated by fitting the bulk Seebeck coefficient and mobility data, and provides information near the optimum bulk carrier concentration of about $6\times10^{18}$ cm$^{-3}$ where $S^2\sigma=38$ $\mu$W/cm-K$^2$ is expected. It should be noted that because of slightly lower electron mobilities, the power factors for single-layer PbTe films are below the bulk PbTe curve. It should also be noted that the two-dimensional (2-D) power factor $S^2\sigma_w$ for thick-quantum-well films are somewhat further below the bulk PbTe curve, primarily due to low mobility.

However, for thin PbTe quantum wells, significantly higher 2D power factors are seen despite their generally lower mobilities. For the highest mobility sample T-225, the power factor is 130 $\mu$W/cm-K$^2$.

Figure 5:
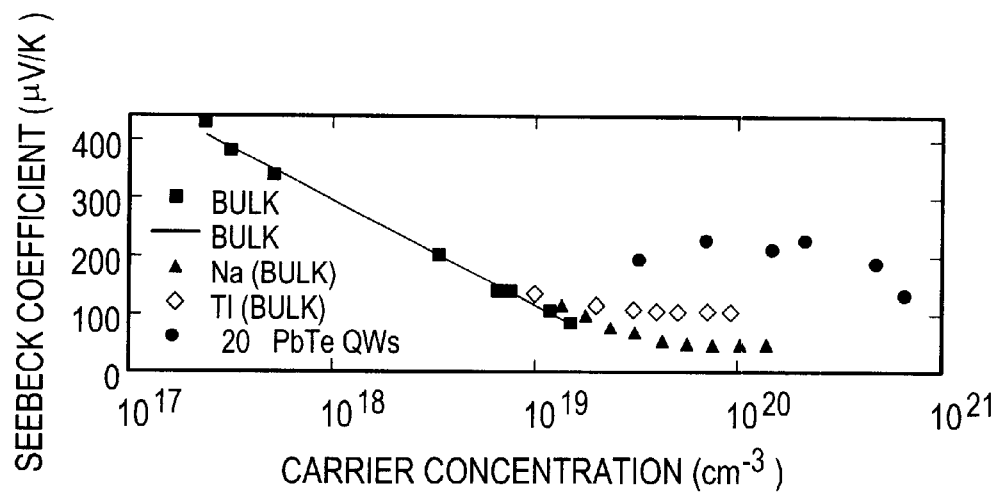
FIG. 5 is a plot of Seebeck coefficient vs. hole carrier concentration for bulk p-type PbTe and p-type PbTe/$Pb_{0.927}Eu_{0.073}Te/PbTe$ multiple quantum well structures.

Referring now to FIG. 5 a plot of Seebeck coefficient vs. hole carrier concentration for bulk p-type PbTe and p-type PbTe/$Pb_{0.927}Eu_{0.073}$Te/PbTe multiple quantum well structures is shown.

Multiple-quantum-well (MQW) structures composed solely of Pb-salt materials have been found to have high Seebeck coefficients (up to ~400 $\mu$V/K), to grow with excellent structural quality, and to not have the autodoping problem of $Bi_ySb_{1-y}/PbTe_{1-z}Se_z$ MQW structures. Consequently, Pb-salt MQW structures have provided an excellent medium for investigation of thermoelectric superlattices. The $Pb_{1-x}Eu_xTe/PbTe$ materials system not only serves as a good vehicle for testing quantum-confinement effects on the Seebeck coefficient, but also can be used to indicate the magnitude of the thermal conductivity reduction expected in MQW superlattice structures due to phonon-interface scattering.

High-quality $Pb_{1-x}Eu_xTe/PbTe$ MQW structures grown by molecular beam epitaxy (MBE) and including a very thin, partial monolayer of $BaF_2$ inserted in the center of a $Pb_{0.927}Eu_{0.073}$Te barrier provides an effective acceptor dopant and results in a material having very high p-type thermoelectric power factor $P_{F2D}$ and figures of merit $Z_{2D}T$. At 300 K, $P_{F2D}$ values up to ~160 $\mu$Wcm$^{-1}$K$^{-2}$ have been measured and values $Z_{2D}T>1.5$ have been achieved for the p-type quantum wells. The measured 300- and 400-K thermoelectric properties of the quantum wells are many times better than those of the best bulk PbTe. For p-type PbTe quantum wells, values of $Z_{2D}T>2.3$ at 400 K have been obtained which is higher than other values measured heretofore.

A number of p-type quantum well structures composed of $Pb_{0.927}Eu_{0.073}Te/PbTe$ MQWs grown by the above-described MBE techniques were fabricated. Hole charge carriers were provided to the p-type quantum wells by growing a layer of $BaF_2$ in the middle of the $Pb_{0.927}Eu_{0.073}$Te barriers. In some initial experiments, thicker $BaF_2$ layers were grown to test a double-barrier concept where the first barrier (PbEuTe) provides high-quality interfaces to the quantum well and the second higher-energy barrier ($BaF_2$) provides better carrier confinement, so that the overall barrier thickness can be minimized. Wide barriers are deleterious to realizing a high three-dimensional $Z_{3D}T$ because of high parasitic thermal conductance.

Initial tests involved placing a 2.0-nm-thick layer of $BaF_2$ in the center of the $Pb_{0.927}Eu_{0.073}$Te barriers. It was found, however, that such layers degraded the crystal structure so severely that good thermoelectric properties were not realized. Nevertheless, it has been found via detailed theoretical calculations on this new structure that the use of compound barriers is a good idea.

In subsequent experiments, a thin $BaF_2$ layer was used as an acceptor dopant only. Six $Pb_{0.927}Eu_{0.073}Te/PbTe$ MQW structures were grown with very thin $BaF_2$ layers placed in the barriers; their parameters are tabulated in Tables 5 and 6. The hole carrier concentration increased with $BaF_2$ layer thickness. Sample T-358 with a $BaF_2$ thickness $d_b=0.11$ nm had a three-dimensional carrier concentration $p_{300}=6.2\times10^{18}$ cm$^{-3}$ at 300 K, whereas T-368 with $d_b=0.45$ nm had $p_{300}= 6.2\times10^{19}$ cm$^{-3}$. All of these samples had high Seebeck coefficients, ranging from 151 to 257 $\mu$V/K. The measured mobilities are much higher than is consistent with hole conduction in the $Pb_{0.927}Eu_{0.073}$Te barrier region, so it is reasonable to assume that the carriers are confined to the PbTe quantum wells. The two-dimensional carrier concentrations are obtained by assuming that the carriers are confined to the PbTe quantum wells.

TABLE 5

Parameters of δ-Doped p-Type $Pb_{0.927}Eu_{0.073}Te/PbTe$ Multiple-Quantum-Well Structures

| Sample No. | Sample Thickness ($\mu$m) | Number of Periods | 300-K Seebeck Coefficient ($\mu$V/K) | Three-Dimensional Carrier Concentration | | Carrier Mobility | |
|---|---|---|---|---|---|---|---|
| | | | | 300 K (cm$^{-3}$) | 77 K (cm$^{-3}$) | 300 K (cm$^{-2}$/V s) | 77 K (cm$^{-2}$/V s) |
| T-329 | 5.25 | 224 | +241 | $1.8\times10^{19}$ | $1.5\times10^{19}$ | 77 | 345 |
| T-331 | 5.25 | 224 | +229 | $1.3\times10^{19}$ | $1.3\times10^{19}$ | 110 | 400 |
| T-371 | 5.58 | 238 | +206 | $4.1\times10^{19}$ | $1.6\times10^{19}$ | 39 | 190 |
| T-368 | 4.59 | 205 | +151 | $6.2\times10^{19}$ | $2.4\times10^{19}$ | 35 | 200 |
| T-358 | 5.25 | 220 | +242 | $6.2\times10^{18}$ | $3.9\times10^{18}$ | 120 | 720 |
| T-332 | 4.76 | 204 | +257 | $4.1\times10^{18}$ | $2.3\times10^{18}$ | 120 | 770 |

TABLE 6

More Parameters of δ-Doped p-Type $Pb_{0.927}Eu_{0.073}Te/PbTe$ Multiple-Quantum-Well Structures

| | Thickness | | | Two-Dimensional Carrier Concentration | |
|---|---|---|---|---|---|
| | PbTe | $BaF_2$ | $Pb_{0.927}Eu_{0.073}Te$ | | |
| Sample No. | Well $d_w$(nm) | δ-Doped $d_b$(nm) | Barrier $d_b$(nm) | 300 K ($cm^{-3}$) | 77 K ($cm^{-3}$) |
| T-329 | 1.91 | 0.22 | 19 | $2.0 \times 10^{20}$ | $1.7 \times 10^{20}$ |
| T-331 | 1.91 | 0.22 | 19 | $1.6 \times 10^{20}$ | $1.6 \times 10^{20}$ |
| T-371 | 2.07 | 0.22 | 20 | $4.5 \times 10^{20}$ | $1.6 \times 10^{20}$ |
| T-368 | 1.97 | 0.45 | 19 | $6.7 \times 10^{20}$ | $2.7 \times 10^{20}$ |
| T-358 | 1.90 | 0.11 | 19 | $6.8 \times 10^{19}$ | $4.3 \times 10^{19}$ |
| T-332 | 1.88 | 0.22 | 19 | $4.9 \times 10^{19}$ | $2.8 \times 10^{19}$ |

To evaluate the PbTe MQW data, we have compared these results with bulk PbTe. Properties of the best bulk p-type PbTe samples known are listed in Table 7.

TABLE 7

Thermoelectric Properties of High-Quality p-Type Bulk PbTe Samples

| Sample No.* | 300-K Seebeck Coefficient S ($\mu$V/K) | 300-K Power Factor ($\mu$W/cm $K^2$) | Carrier Concentration p ($cm^{-3}$) | | Carrier Mobility $\mu$($cm^2$/V s) | |
|---|---|---|---|---|---|---|
| | | | 300 K | 77 K | 300 K | 77 K |
| 3-69 | +431 | 5.2 | $2.2 \times 10^{17}$ | $2.1 \times 10^{17}$ | 770 | 27000 |
| 5-70H1B | +388 | 5.4 | $3.0 \times 10^{17}$ | $3.3 \times 10^{17}$ | 740 | 23000 |
| 5-70H1A | +346 | 7.7 | $4.9 \times 10^{17}$ | $5.4 \times 10^{17}$ | 830 | 22000 |
| 2-71H1 | +213 | 22.7 | $3.3 \times 10^{18}$ | $4.6 \times 10^{18}$ | 950 | 15000 |
| 1-72H1 | +155 | 20.9 | $6.7 \times 10^{18}$ | $9.7 \times 10^{18}$ | 810 | 9000 |
| 12-71H1 | +154 | 24.0 | $7.4 \times 10^{18}$ | $1.1 \times 10^{19}$ | 850 | 9100 |
| 1-72H6C | +117 | 21.4 | $1.25 \times 10^{19}$ | $2.3 \times 10^{19}$ | 780 | 4100 |
| 1-72H4B | +95 | 17.0 | $1.5 \times 10^{19}$ | $2.8 \times 10^{19}$ | 780 | 4800 |
| T-376* | +170 | 31.2 | $1.7 \times 10^{19}$ | $2.2 \times 10^{19}$ | 385 | 1,700 |

*All samples are Bridgman grown, except sample T-376, which is an epitaxial single layer of $BaF_2$-doped PbTe grown by molecular beam epitaxy.

Properties of an MBE-grown uniformly $BaF_2$-doped single-layer PbTe samples are shown in Table 7. This sample has a power factor 31.2 $\mu$W/cm $K^2$ and a bulk $Z_{3D}T=0.38$ at 300 K, which are values somewhat higher than those for any other p dopant in bulk PbTe.

Also shown in Table 7 are the properties of the best bulk p-type PbTe samples known. These bulk materials were prepared from semiconductor-grade Pb and Te, grown by the Bridgman method, and were polycrystalline with large-grain sizes. The low-concentration samples were undoped whereas the higher-concentration samples were doped with various impurities such as Ag, Au, and P. Seebeck coefficients at 300 K varied from +431 $\mu$V/K at low carrier concentrations to +95 $\mu$V/K at the highest concentration. At lower carrier concentrations, the highest 300-K carrier mobility was 950 $cm^2$/V s, which decreases to 780 $cm^2$/V s at a carrier concentration of $1.5 \times 10^{19}$ $cm^{-3}$. A semilog plot of these S vs p data for bulk PbTe may be generated and fit by a straight line given by the simple expression.

$$S(\mu V/K) = +477 - 175 \log_{10}(p/10^{17}\ cm^{-3}).$$

It should be noted that except for changes in signs, this is the same expression that fits the best bulk n-type data for $n < 4 \times 10^{19}$ $cm^{-3}$. This is to be expected since the L conduction band pocket is the mirror image of the L valence band pocket and the electron effective mass is equal to the hole effective mass for the same carrier concentration. The effective mass of each L pocket increases with carrier concentration owing to band nonparabolicity.

It should also be noted that above $\sim 8 \times 10^{18}$ $cm^{-3}$, the data become dependent on the impurity. The difference in Seebeck coefficient between the Tl- and Na-doped bulk samples is attributed in the literature to resonance-impurity scattering in the Tl-doped samples. From Equation (2.1) and the slow mobility change with carrier concentration, a maximum power factor $S^2 p e \mu_n = 24$ $\mu$W/cm $K^2$ at a concentration of $8 \times 10^{18}$ $cm^{-3}$ is obtained but using literature values for Na-doped PbTe a maximum power factor of 28 $\mu$W/cm $K^2$ is obtained at $1.0 \times 10^{19}$ $cm^{-3}$. Using 20 mW/cm K for the lattice thermal conductivity of PbTe, we calculate a maximum figure of merit $ZT_{max} = 0.35$ for p-type bulk PbTe at 300 K.

These results for bulk PbTe can be compared with S vs p data for $BaF_2$ δ-doped MQW structures and with data for an epitaxial layer of p-type PbTe. The MQW-structure data show a nearly constant value (in the range from high $10^{19}$ to $2 \times 10^{20}$ $cm^{-3}$) with increasing carrier concentration similar to that of Na- and Tl-doped bulk material. It is believed that this plateau is a consequence of the valence band structure of PbTe. Holes are predominantly in the L valence band pocket for hole carrier concentrations below mid-$10^{19}$ $cm^{-3}$. Above $2 \times 10^{20}$ $cm^{-3}$, holes are predominantly in Σ valence band pocket. Constant-energy surfaces of the PbTe valence band extrema are shown in FIG. 6.

Figure 6:
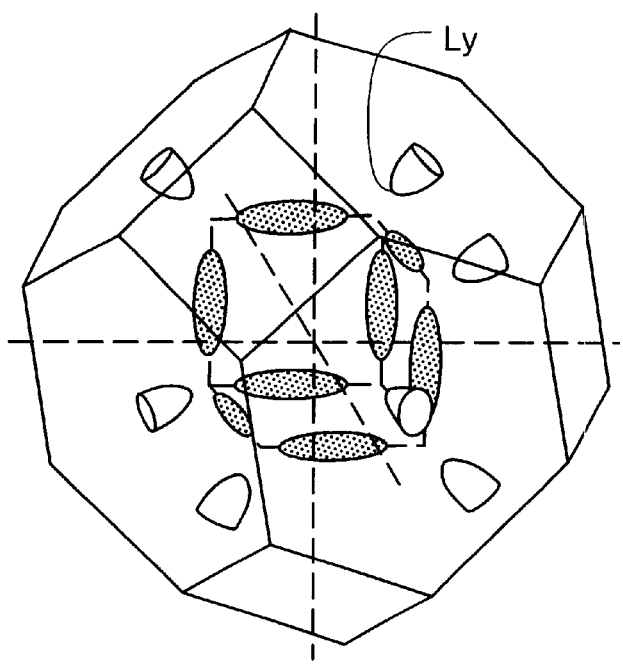
FIG. 6 is a plot of the constant energy surfaces of the PbTe valence band in the Brillouin zone.

Referring briefly to FIG. 6, the maximum extremum is located at the L point (light hole band) of the Brillouin zone and there are eight half or four whole ellipsoids. This is important for thermoelectricity because ZT is directly proportional to the number of ellipsoids (valleys) through the density-of-states effective mass. The next highest valence band extremum is located at the Σ point (heavy hole band) of the Brillouin zone and there are twelve whole ellipsoids, which is very favorable for high ZT. Thus, as the total hole carrier concentration increases, the percentage of (heavy) Σ holes relative to (light) L holes increases with the result that a relatively high Seebeck coefficient persists to extraordinarily high carrier concentrations. It is, therefore, not necessary to invoke impurity resonance scattering to explain the high Seebeck coefficient in Tl-doped PbTe. The Tl-doped PbTe Seebeck coefficient at 120 $\mu$V/K at $12 \times 10^{20}$ $cm^{-3}$ can be calculated using a hole density-of-states effective mass of 1.2, which is reasonable in view of this valence-band structure.

The measured Seebeck coefficients for the MQW samples are approximately a factor of 2 larger than the Seebeck coefficients of bulk Tl-doped PbTe. At the very high carrier concentration of $2\times10^{20}$ cm$^{-3}$, a remarkably high Seebeck coefficient of +240 $\mu$V/K is obtained. It is believed that the 2 times increase in S (4 times increase in power factor S$^2\sigma$ and ZT) is primarily from quantum-well enhancement due to the increased density of states per unit volume of the quantum wells. Furthermore, measurements indicate that the hole carrier mobility can be at least as high as 110 cm$^2$/V x, which is roughly 4 times higher than that of bulk Tl-doped PbTe at this carrier concentration. It is hypothesized that this 4 times mobility enhancement may be due primarily to the δ-doping. Mobility enhancements occurs owing to the suppression of impurity scattering in the quantum wells. At the $2\times10^{20}$ cm$^{-3}$ impurity concentration level, impurity scattering in the bulk material may contribute to some degradation of the carrier mobility, but since the impurities are placed in the middle of the barriers, the carriers in the undoped PbTe quantum wells are not subjected to impurity scattering. Thus, it is believed a large carrier mobility enhancement occurs because of the δ-doping suppression of impurity scattering even though carrier-phonon and carrier-interface scattering does occur in the quantum wells. The relative contributions of the L$_v$ valence band pocket and the Σ valence band pocket to the Seebeck coefficient and the hole carrier mobility may be sorted out via detailed quantitative modeling of the p-type quantum-well superlattice structures.

In Table 8 are listed the two-dimensional power factor $P_{F2D}=S^2pe\mu_n$ and thermoelectric figure of merit $Z_{2D}T$ for the six p-type PbTe MQW samples at 300 K, showing $P_{F2D}$ values as high as 160 $\mu$W/cm K$^2$.

TABLE 8

Thermoelectric Properties at 300K of p-Type
Pb$_{0.927}$Eu$_{0.073}$Te/PbTe
Multiple-Quantum-Well Samples

| Sample No. | Two-Dimensional Power Factor P$_{F2D}$ ($\mu$W/cm K$^2$) | Electrical Conductivity σ$_w$ (mho/cm) | Thermoelectric Figure of Merit* (Wells Only) Z$_{2D}$T |
|---|---|---|---|
| T-329 | 160 | 2700 | 1.5 |
| T-331 | 150 | 2800 | 1.4 |
| T-371 | 119 | 2800 | 1.1 |
| T-368 | 88.5 | 3900 | 0.7 |
| T-358 | 73 | 3900 | 0.9 |
| T-332 | 63.5 | 960 | 0.8 |

*A literature value of the lattice thermal conductivity of 20 mW/cm K was assumed for the PbTe quantum wells and may be too high.

Figure 7:
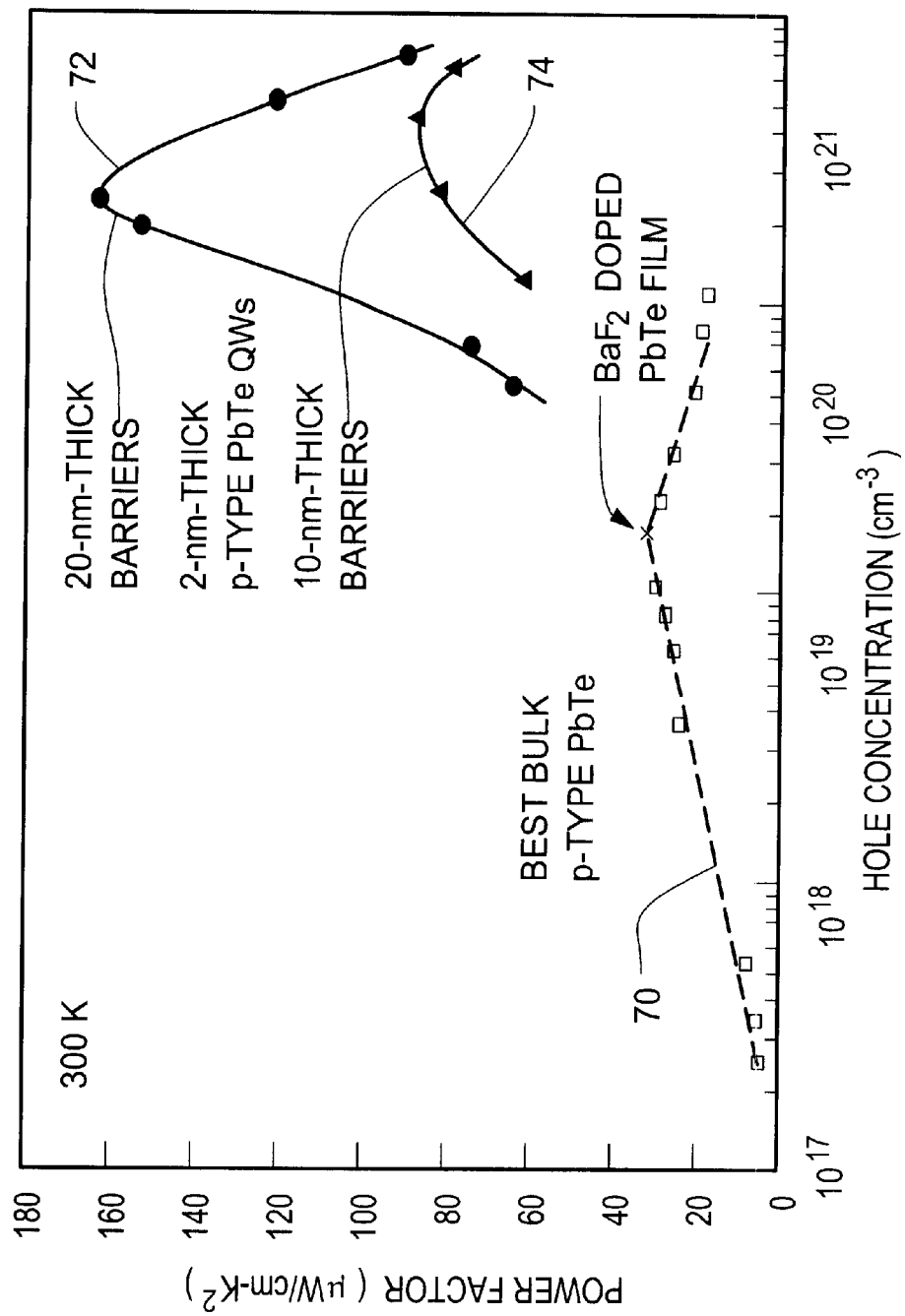
FIG. 7 is a plot of thermoelectric power factor vs. carrier concentration for p-type bulk PbTe, a single $BaF_2$-doped epitaxial PbTe layer and p-type $Pb_{0.927}Eu_{0.073}Te/PbTe$ quantum wells.

Power factors (S$^2\sigma$ bulk or single layer and S$^2\sigma_w$ for quantum well) from Tables 7 and 8 are presented in FIG. 7 as a function of the carrier concentration at 300 K. The bulk data show a very broad peak centered at a concentration $\sim1.5\times10^{19}$ cm$^{-3}$, whereas the MQW data peak is much higher and narrower and centered at $\sim2\times10^{20}$ cm$^{-3}$. The 2-nm-thick PbTe quantum wells with ~20-nm-thick barriers have higher two-dimensional power factors than found for similar n-type quantum wells despite having a much lower carrier mobility. For the best sample, T-329, the power factor is 160 $\mu$W/cm K$^2$, the highest reported to date for good thermoelectric materials.

The best thermoelectric properties at 300 K for the—and p-type PbTe quantum wells investigated in the past two years are summarized in Table 9.

TABLE 9

Best Measured Power Factors and
Estimated Overall Thermoelectric Figures of Merit
Z$_{3D}$T for 2.0-nm-thick PbTe Quantum-Well Structures at 300K

| Year | Carrier Type | Barrier Thickness (nm) | Power Factor Ratio (S$^2\sigma$)$_{2D}$/(S$^2\sigma$)$_{bulk}$ | Estimated Thermoelectric Figure of Merit Z$_{3D}$T* |
|---|---|---|---|---|
| 1995 | n-type | 40.7 | 3.5 | 0.11 |
| 1996 | p-type | 19.3 | 4.0 | 0.24 |

*These estimated values may be low because the lattice thermal conductivity may be less than the assumed bulk PbTe values used in Table 8 due to phonon-interface scattering in the multiple-quantum-well superlattice structures.

It should be noted that power factors in p-type quantum wells that are ~4 times the best bulk or single-layer value have been achieved in accordance with the techniques of the present invention, and these power factors were achieved with a barrier thickness less than half as thick as that for the previously described n-type MQW structures. Using the accepted bulk value of 20 mW/cm K for the lattice thermal conductivity, estimates of Z$_{3D}$T as high as 0.24 and Z$_{2D}$T= 1.5 at 300 K have been made. At 400 K, two-dimensional figures of merit (Z$_{2D}$T) greater than 2.3 are achieved. Since it is expected that interface scattering in the MQW structure is lowering the thermal conductivity, the actual ZT values may be considerably higher and such characteristics can be determined by measuring the thermal conductivity of the thin layers.

The three-dimensional properties of these p-type quantum wells with an electrical conductivity of 275 mho cm$^{-1}$ and a Seebeck coefficient S of +241 $\mu$V/K at 300 K are intriguing. The composition of the best MQW structure is 9% PbTe, 1% BaF$_2$, and 90% Pb$_{0.927}$Eu$_{0.073}$Te. However, BaF$_2$ and Pb$_{0.927}$Eu$_{0.073}$Te have no charge carriers and essentially zero Z$_{3D}$T. Thus, despite the fact that only the 9% PbTe part of the sample is thermoelectrically active, the overall estimated Z$_{3D}$T is 0.24 at 300 K.

In view of the above, the unusually high maximum power factor is believed to be the result of a combination of three factors: the quantum-well enhancement effect on the density of states per unit volume, the high density-of-states effective mass hole pocket at the Σ valence band, and δ-doping.

Referring now to FIG. 7, a plot of the power factor of p-type bulk PbTe and PbTe quantum wells are shown as a function of carrier concentration at a temperature of 300 K. Curve 72 was generated utilizing the bulk Seebeck coefficient and mobility data and curve fitting technique. As can be seen from the plot of curve 72, the two-dimensional (2-D) power factor for 2-nm-thick p-type PbTe quantum wells with a barrier thickness of 20 nm has a peak power factor of 160 $\mu$W/cm-K$^2$ which is higher than that for the same structure doped with an n-type dopant. This second much higher maximum in power factor is believed to be a result of a combination of factors such as quantum effects and the heavy hole Σ-valence subband.

Figure 8:
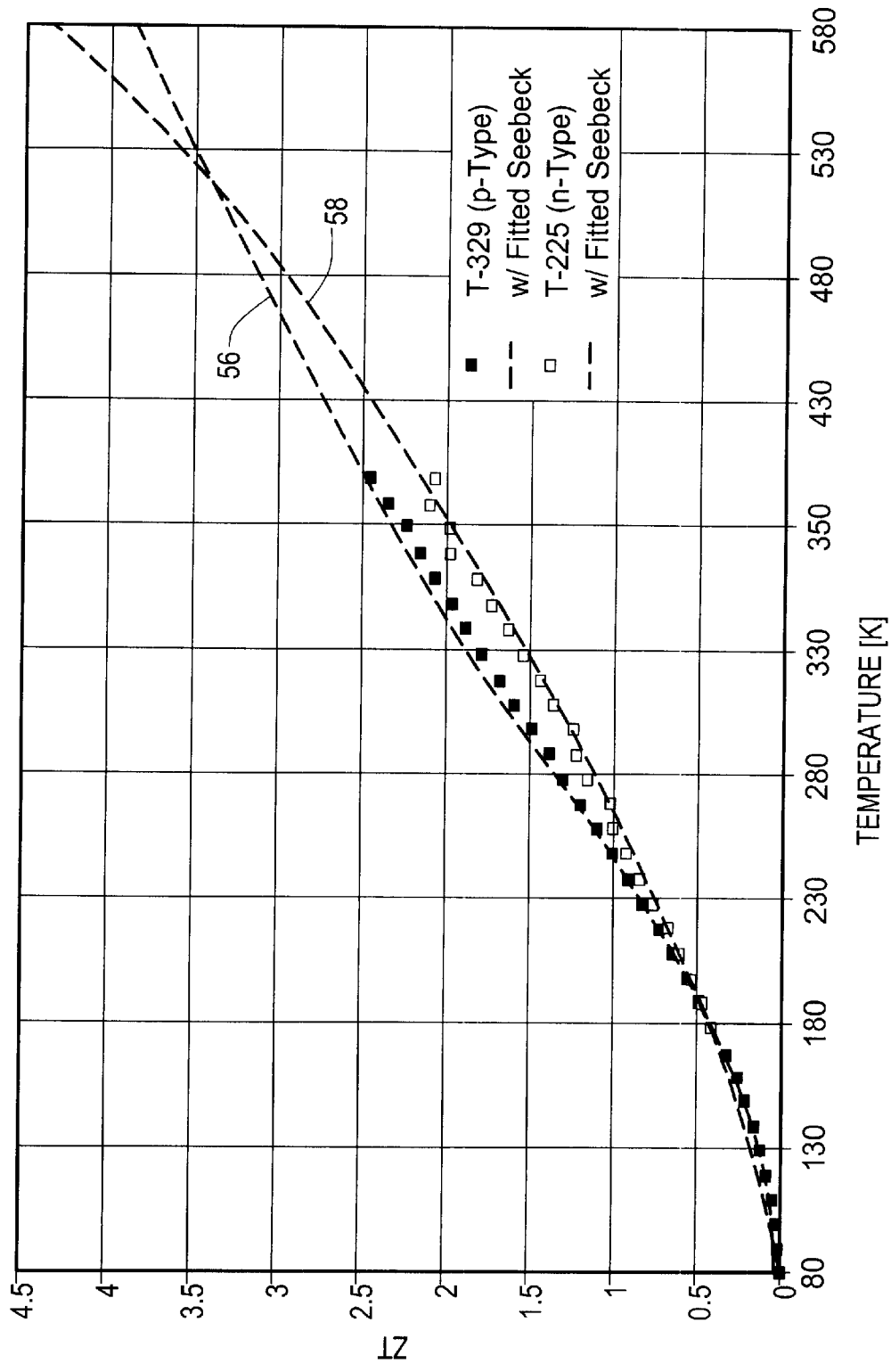
FIG. 8 is a plot of figure of merit vs. temperature for p-type and n-type $Pb_{0.927}Eu_{0.073}Te/PbTe$ quantum wells.

Referring now to FIG. 8, a plot of the figure of merit versus temperature for p-type and n-type material is shown. As can be seen in the FIG. 8, the figure of merit for the Pb-salt superlattice structures rises with increasing temperature above the figures of merits achievable with conventional structures at any temperature.

Figure 9:
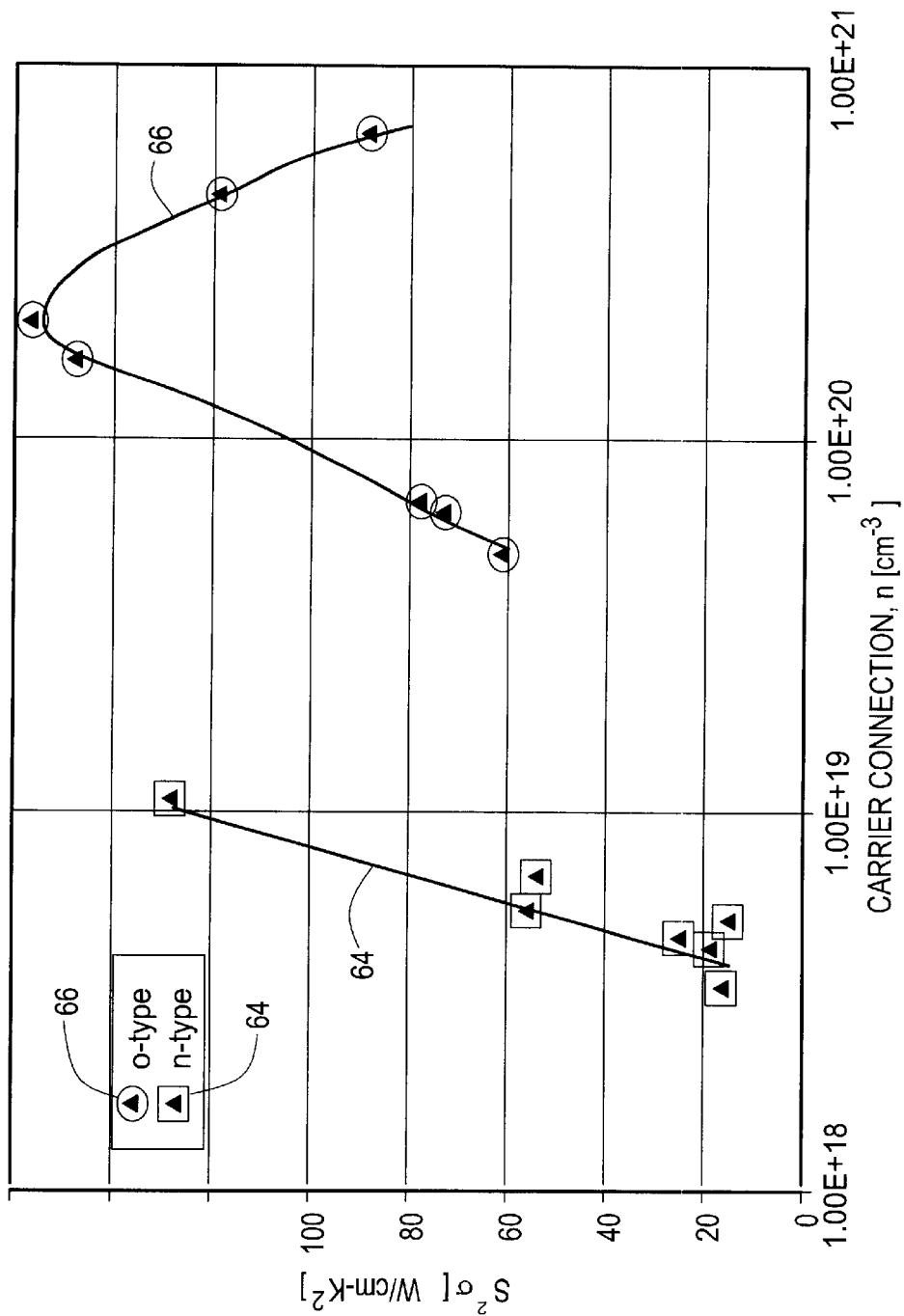
FIG. 9 is a plot of thermoelectric power factor vs. carrier concentration for n-type and p-type $Pb_{0.927}Eu_{0.073}Te/PbTe$ quantum wells.

Referring now to FIG. 9, a plot of thermoelectric power factor vs. carrier concentration for n-type and p-type Pb$_{0.927}$Eu$_{0.073}$Te/PbTe quantum wells is shown. The n-type material reaches its solubility limit prior to turning lower while the p-type material reaches a maximum power factor at a dopant concentration of about $2 \times 10^{20}$ cm$^{-3}$.

Figure 10:
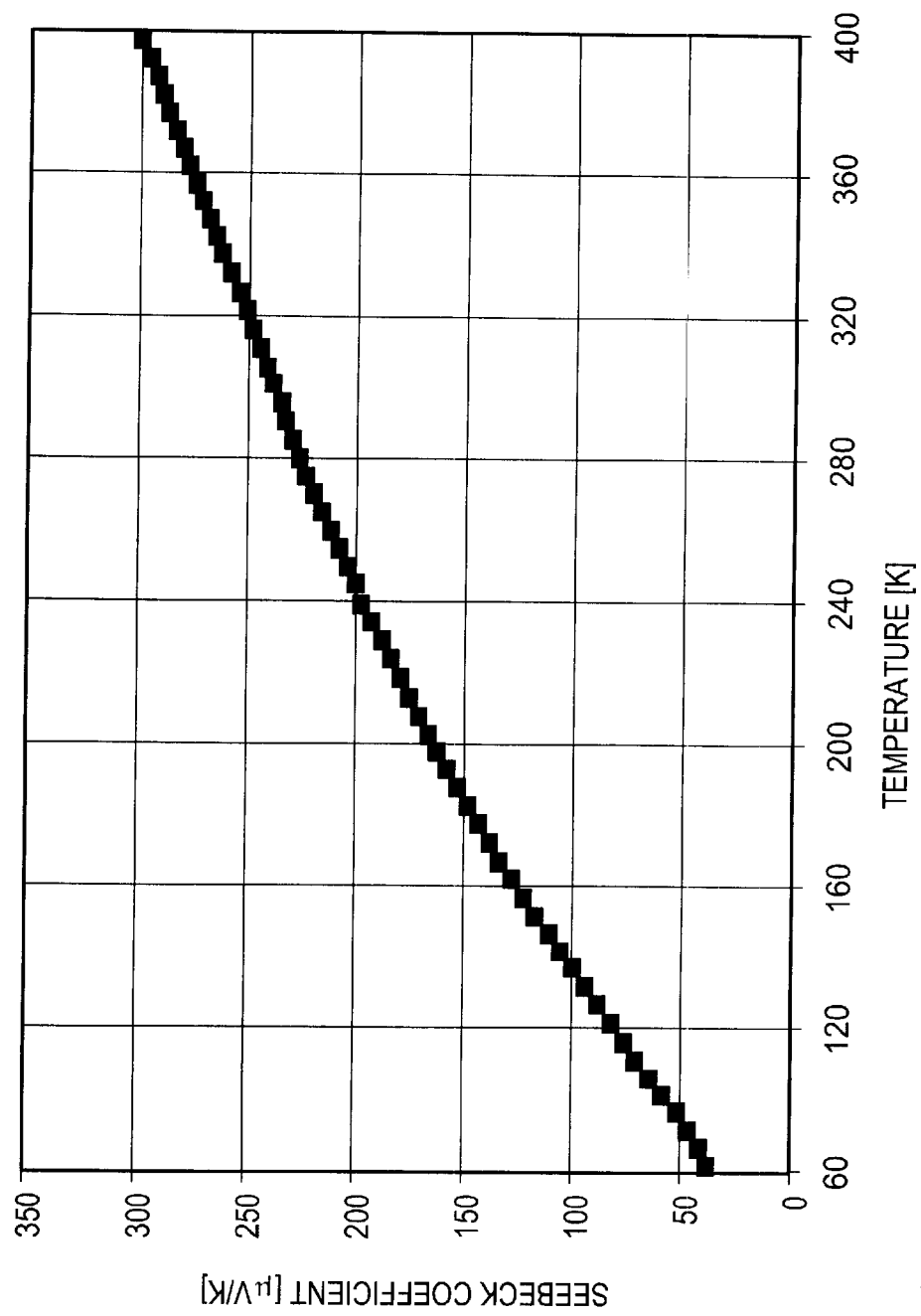
FIG. 10 is a plot of Seebeck coefficient vs. temperature for a p-type $Pb_{0.927}Eu_{0.073}Te/PbTe$ quantum well.

Referring now to FIG. 10, a plot of the measured Seebeck coefficient versus temperature data from 80 K to 400 K is shown. Each square on the graph represents a measured value. The low Seebeck coefficient value at 80 K is due to the high hole carrier concentration and lower temperature. The high Seebeck coefficient value at 400 K is due to a significant number of the holes being thermally excited into the high-effective-mass Σ-valence subband.

Figure 11:
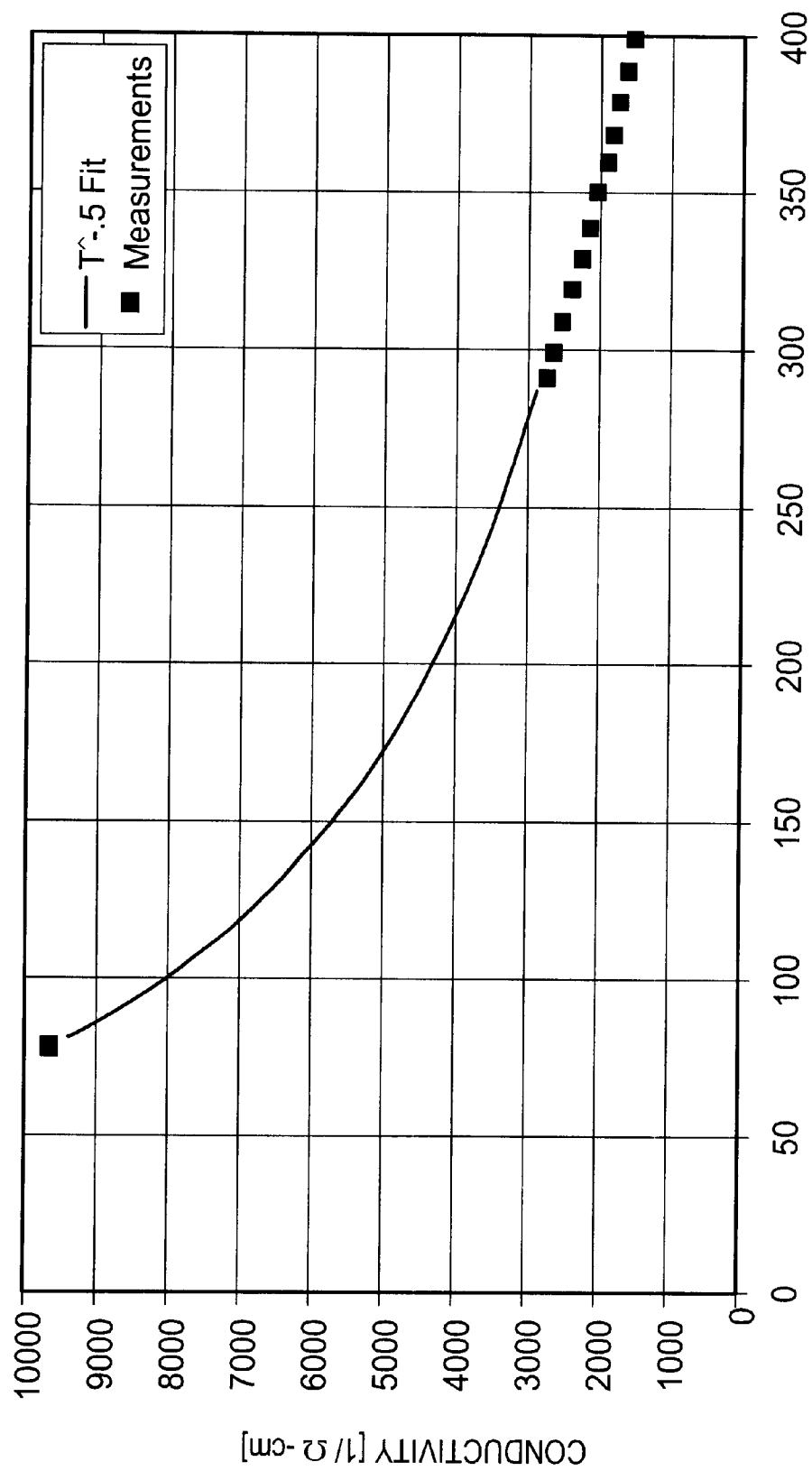
FIG. 11 is a plot of electrical conductivity vs. temperature for p-type $Pb_{0.927}Eu_{0.073}Te/PbTe$ quantum wells.

Referring now to FIG. 11, a plot of calculated and measured electrical conductivity versus temperature curve is displayed for a p-type $Pb_{0.927}Eu_{0.073}Te/PbTe$ multiple-quantum-well sample. The smooth curve is calculated assuming an inverse temperature to the minus one-half power. It should be noted that this power dependence also fits the measured electrical conductivity versus temperature curve for an n-type $Pb_{0.927}Eu_{0.073}Te/PbTe$ multiple-quantum-well sample.

Figure 12:
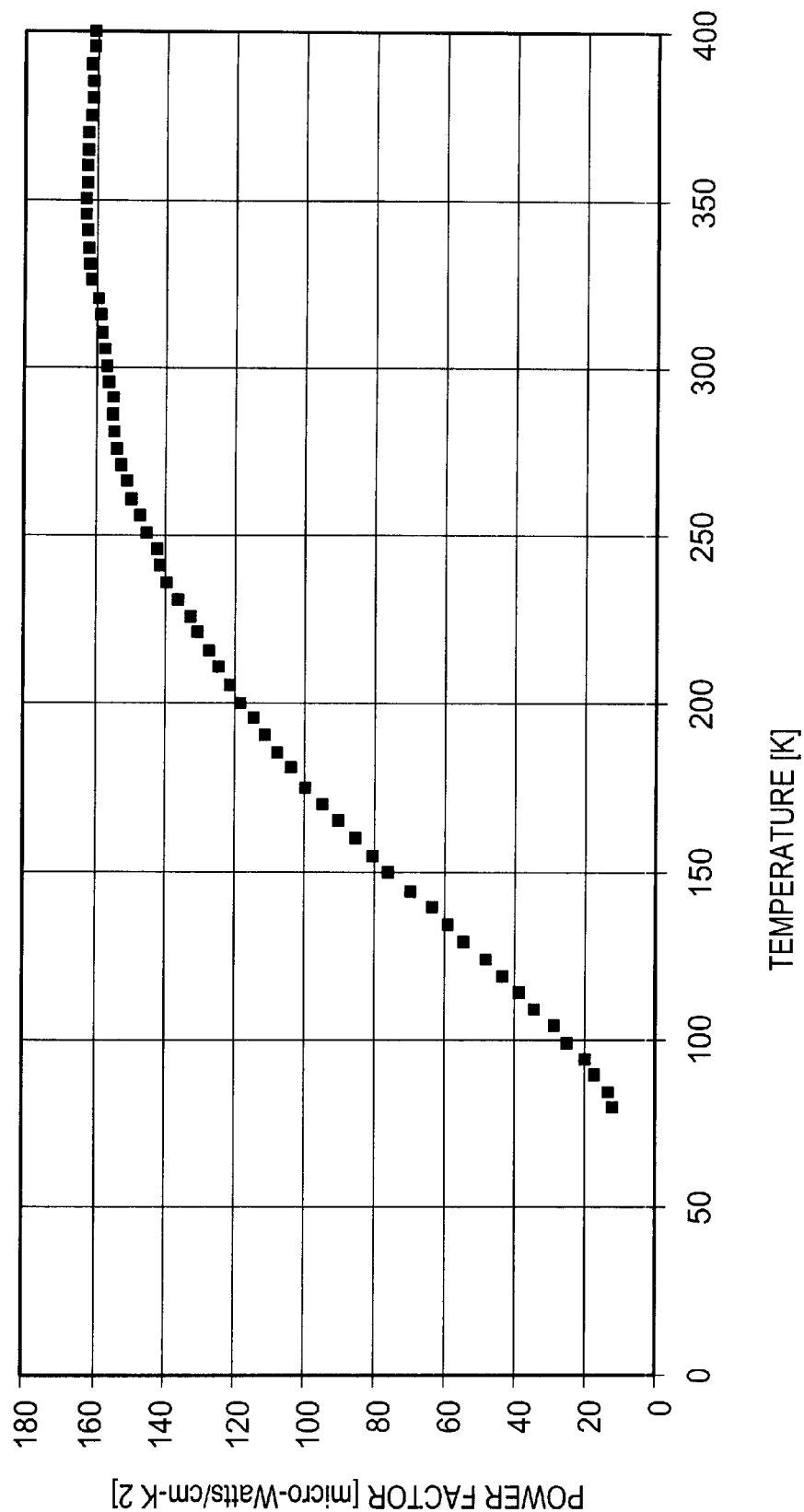
FIG. 12 is a plot of thermoelectric power factor vs. temperature for a p-type PbTe quantum well.

Referring now to FIG. 12, is a plot of power factor as a function of temperature using the data from FIGS. 10 and 11. A maximum value of approximately 160 $\mu$W/cm-K$^2$ was obtained in the 300 K to 400 K temperature range, assuming all of the holes are in the PbTe quantum wells. It should be noted that the high power factors occur with relatively low hole carrier mobilities in the 80 to 100 cm$^2$/V-s range.

Figure 13:
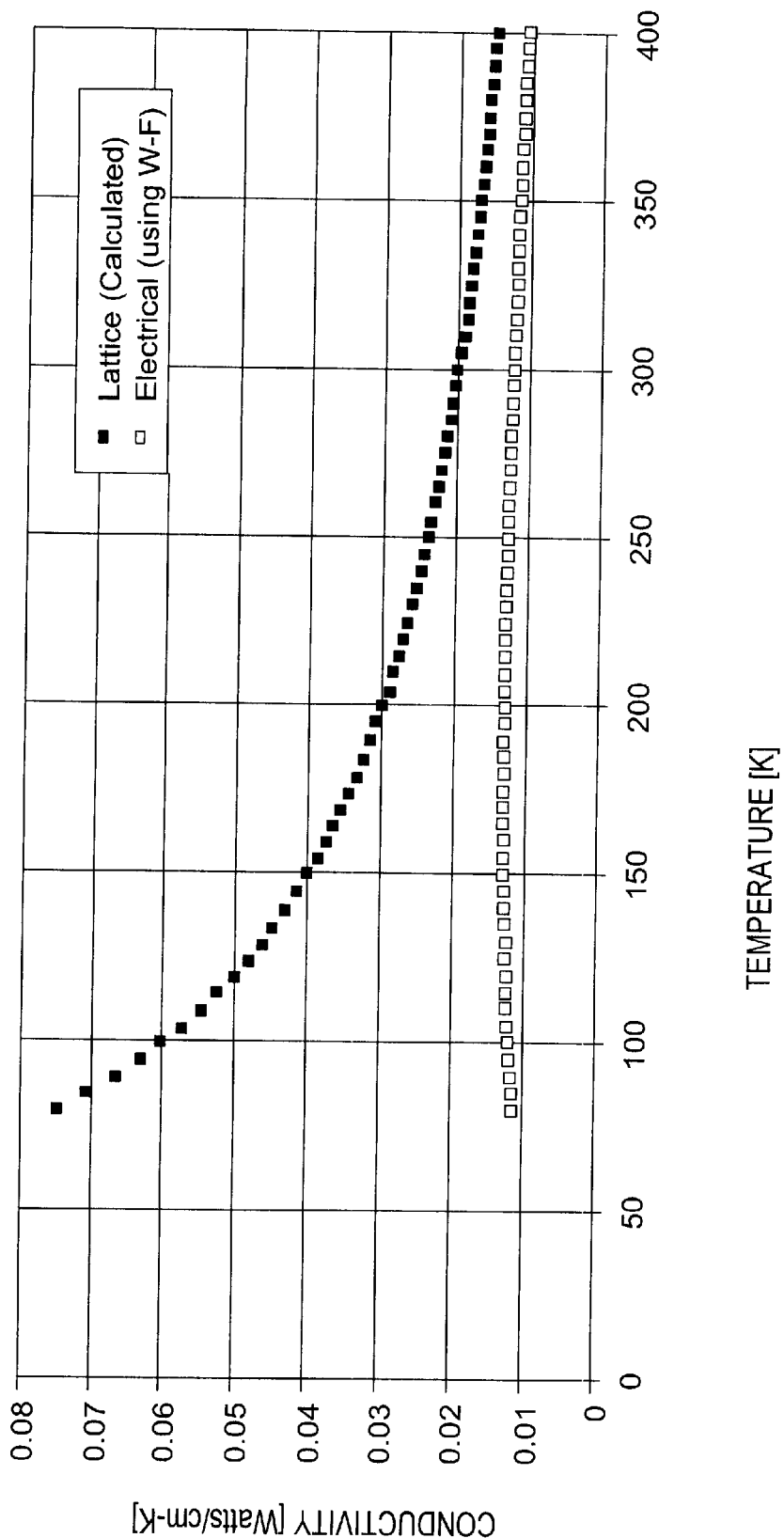
FIG. 13 is a plot of thermal conductivity versus temperature for a p-type PbTe quantum well.

Referring now to FIG. 13, a plot of thermal conductivity versus temperature for p-type PbTe quantum wells illustrating the lattice and electronic portions of the thermal conductivity versus temperature. The lattice portion was computed using an inverse temperature dependence and the literature value for the 300 K lattice thermal conductivity of PbTe. The electronic portion of the thermal conductivity was computed from the Wiedemann-Franz law using the measured electrical conductivity from a previous figure.

Figure 14:
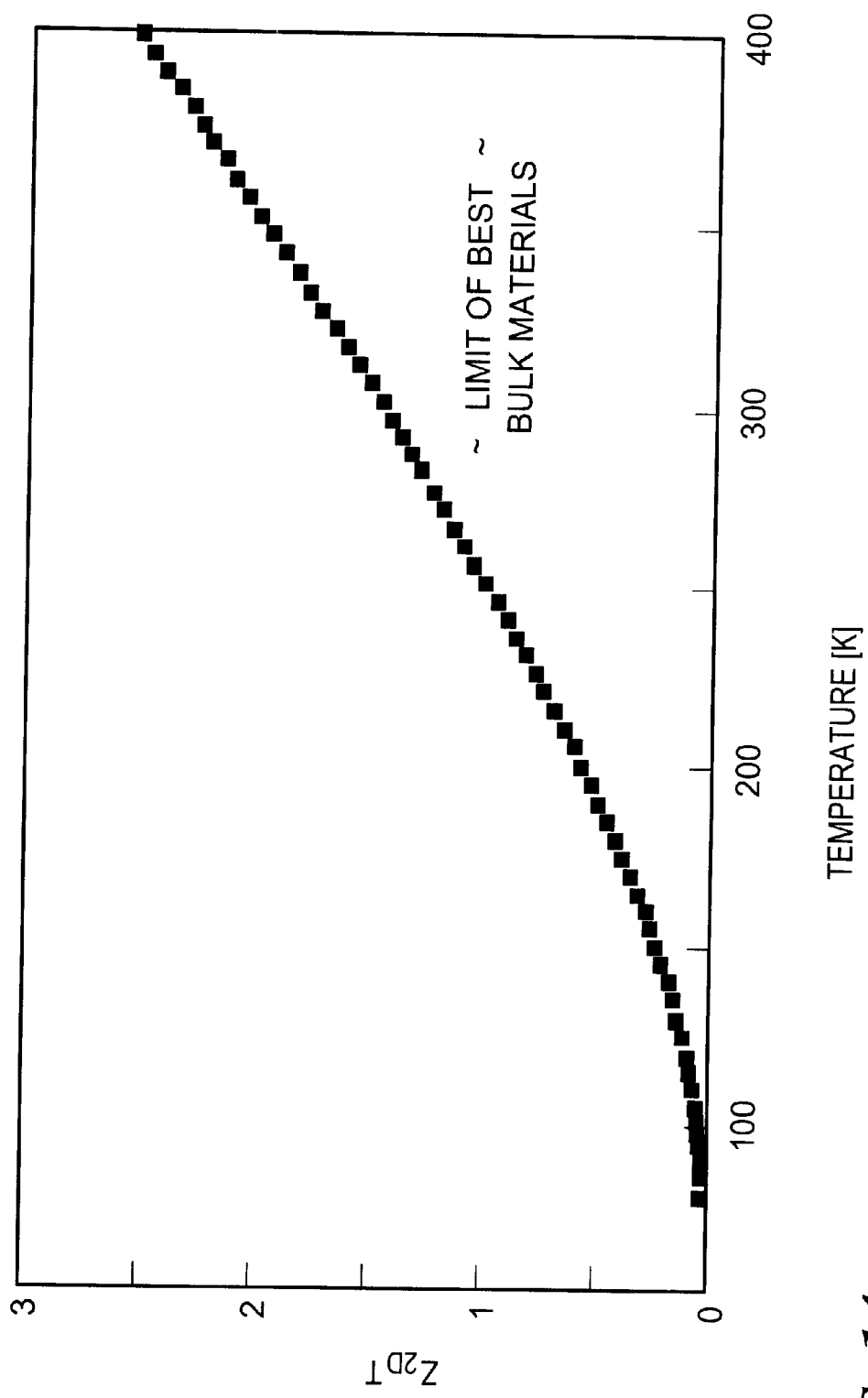
FIG. 14 is a plot of the two-dimensional figure of merit ($Z_{2D}T$) for p-type PbTe quantum wells.

Referring now to FIG. 14, a plot of the two-dimensional figure of merit ($Z_{2D}T$) is shown. The curve is generated from the power factor and thermal conductivity curves to obtain the figure of merit for the p-type PbTe quantum wells versus temperature. As can be seen from FIG. 14, the estimated figure of merit of the PbTe quantum wells rises from 1.5 at room temperature to a value of 2.5 at 400 K. The curve is climbing steeply with increasing temperature and values over 3 are anticipated at higher temperatures, assuming all of the holes are in the PbTe quantum wells. These unusually high values were obtained even though the conservative assumption of bulk lattice thermal conductivities in the quantum wells was used.

In summary, the results on p-type PbTe show that $Pb_{0.927}Eu_{0.073}Te/PbTe$ multiple-quantum-well samples yield p-type Seebeck coefficients of approximately 240 $\mu$V/K if the 20-nm-thick $Pb_{0.927}Eu_{0.073}Te$ barriers are properly delta-doped with BaF$_2$. If it is assumed that all the holes are in the PbTe quantum wells, then the hole carrier concentration is in the $10^{20}$ cm$^{-3}$ range. In the heavily doped p-type carrier concentration range, the Seebeck coefficient varies weakly with carrier concentration unlike n-type PbTe quantum wells. Very-high-quantum-well thermoelectric figures of merit were found in these samples of up to 2.5 at 400 K based on the conservative assumption that the lattice thermal conductivity is the same as bulk PbTe. Even higher values for ZT are projected for temperatures above 400 K.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the disclosed embodiments.

What is claimed is:

1. A superlattice structure for thermoelectric power generation comprising:

m monolayers of a first barrier material alternating with n monolayers of a second quantum well material doped to a dopant concentration in the range of about $4.1 \times 10^{19}$ cm$^{-3}$ to $1 \times 10^{21}$ cm$^{-3}$ with a pair of monolayers defining a superlattice period and each of the materials having a relatively smooth interface therebetween and wherein: each of said quantum well layers have a thickness which is less than the thickness of the barrier layer by an amount which causes substantial confinement of conduction carriers to the quantum well layer; and said alternating layers provide the superlattice structure having a thermoelectric figure of merit which increases with increasing temperature above a temperature of about 380° K.

2. The superlattice structure of claim 1 wherein the barrier layers are provided having a thickness which is in the range of 5–10 times thicker than the thickness of said quantum well layers.

3. The superlattice structure of claim 2 having a thermoelectric figure of merit greater than 1.5.

4. The superlattice structure of claim 3 wherein the dopant concentration of the quantum well material is in the range of $1 \times 10^{19}$ cm$^{-3}$ to $1 \times 10^{21}$ cm$^{-3}$.

5. The superlattice structure of claim 3 wherein said quantum well layers are provided as p-type PbTe quantum well layers having a thickness of about 2 nm.

6. A superlattice structure for a thermoelectric element used for thermoelectric power generation, the superlattice structure comprising a plurality of epitaxially grown alternating layers of materials A and B, where A and B are substantially lattice matched in a direction perpendicular to the direction of growth and wherein a first one of the layers corresponds to a barrier layer and a second one of the layers corresponds to a well layer and wherein the well layer is doped to a dopant concentration in the range of about $4.1 \times 10^{19}$ cm$^{-3}$ to $1 \times 10^{21}$ cm$^{-3}$ and wherein the epitaxially grown alternating layers are formed from materials which provide the superlattice structure having a thermoelectric figure of merit which increases with increasing temperature above a temperature of about 380° K.

7. The superlattice structure of claim 6 wherein:

each layer formed from material A corresponds to a barrier layer comprising $Pb_{1-y}Eu_yTe$ wherein $0 \leq y \leq 1$; and each layer formed from material B corresponds to a quantum well layer comprising PbTe.

8. The superlattice structure of claim 7 further comprising a buffer layer over which said epitaxially grown alternating layers of materials A and B are disposed.

9. The superlattice structure of claim 8 wherein said buffer layer comprises $Pb_{1-y}Eu_yTe$ wherein $0 \leq y \leq 1$.

10. The superlattice structure of claim 9 further comprising a substrate provided from BaF$_2$.

11. A superlattice structure formed on a substrate for use in a device for thermoelectric power generation said superlattice structure comprising:

a buffer layer of $Pb_{1-y}Eu_yTe$ formed on one surface of the substrate wherein $0 \leq y \leq 1$;

a plurality of alternating barrier layers and quantum well layers formed on the buffer layer opposite from the substrate with each barrier layer comprising $Pb_{1-y}Eu_yTe$ wherein $0 \leq y \leq 1$ and each quantum well layer comprising PbTe, said quantum well layer doped to a dopant concentration in the range of about $4.1 \times 10^{19}$ $cm^{-3}$ to $10^{21}$ $cm^{-3}$ such that the superlattice structure is provided having a thermoelectric figure of merit which increases with increasing temperature from 380° K. to 580° K.; and the superlattice structure extending generally uniformly from the buffer layer through the alternating barrier layers and quantum well layers.

12. The superlattice structure of claim 11 wherein said quantum well layers are provided having a thickness of about 20 angstroms.

13. The superlattice structure of claim 11 wherein said quantum well layers are provided having a thickness not less than 15 angstroms.

14. The superlattice structure of claim 13 wherein said barrier layers are provided having a thickness typically of about 400 angstroms and are doped with an n-type dopant.

15. The superlattice structure of claim 14 wherein said barrier layers are provided having a compositional ratio Pb to Eu in the range of 0.3 to 0.7.

16. The superlattice structure of claim 15 wherein said barrier layers comprise $Pb_{0.7}Eu_{0.3}Te$.

17. The superlattice structure of claim 13 wherein said barrier layers are provided having a thickness typically of about 200 angstroms and are doped with a p-type dopant.

18. The superlattice structure of claim 17 wherein said barrier layers are provided having a compositional ratio Pb to Eu in the range of 0.3 to 0.7.

19. The superlattice structure of claim 18 wherein said barrier layers comprise $Pb_{0.7}Eu_{0.3}Te$.

20. The superlattice structure of claim 11 wherein said quantum well layers are doped with a p-type dopant to a dopant concentration in the range of about $5 \times 10^{19}$ $cm^{-3}$ to about $1 \times 10^{21}$ $cm^{-3}$.

21. A method of generating thermoelectric power comprising:

providing a superlattice structure for thermoelectric power generation comprising m monolayers of a first barrier material alternating with n monolayers of a second quantum well material with a pair of monolayers defining a superlattice period and each of the materials having a relatively smooth interface therebetween and wherein each of the quantum well layers have a thickness which is less than the thickness of the barrier layer by an amount which causes substantial confinement of conduction carriers to the quantum well layer and the alternating layers provide the superlattice structure having a figure of merit which increases with increasing temperature; and operating said superlattice structure above a temperature of about 380° K.

* * * * *

UNITED STATES PATENT AND TRADEMARK OFFICE
CERTIFICATE OF CORRECTION

PATENT NO.    : 6,452,206 B1
DATED         : September 17, 2002
INVENTOR(S)   : Harman et al.

It is certified that error appears in the above-identified patent and that said Letters Patent is hereby corrected as shown below:

Column 1,
Line 8, under the "U.S. Government Interest" section delete the entire paragraph and replace with -- This invention was made with government support under Contract Number N00167-92-K-0052 awarded by the Navy and Contract Number F19628-90-C-0002 awarded by the Air Force. The government has certain rights in the invention. --.

Column 3,
Line 12, reads "electrooptic" should read -- electro-optic --.
Line 25, reads "made fabricated" should read -- fabricated --.

Column 4,
Line 58, reads "super-lattice" should read -- superlattice --.

Column 5,
Lines 11, 15, 23 and 27, reads "super-lattice" should read -- superlattice --.
Line 43, reads "10 A to 500 A with 20 A" should read -- 10 Å to 500 Å with 20 Å --.
Line 59, reads "be provide" should read -- be provided --.

Column 7,
Line 25, reads "490ºC." should read -- 490ºC --.
Line 26, reads "350ºC." should read -- 350ºC --.
Line 27, reads "300ºC." should read -- 300ºC --.
Line 32, reads "2 min" should read -- 2 min. --.
Line 38, reads "min for" should read -- min. for --.
Line 51, reads "growth and" should read -- growth is --.

Column 9,
Line 19, reads "Values of S $n_w$," should read -- Values of S, $n_w$ and --.
Line 40, reads "diam" should read -- diam. --.

Column 10,
Line 8, reads "ratio vs" should read -- ratio vs. --.

UNITED STATES PATENT AND TRADEMARK OFFICE
CERTIFICATE OF CORRECTION

PATENT NO. : 6,452,206 B1
DATED : September 17, 2002
INVENTOR(S) : Harman et al.

It is certified that error appears in the above-identified patent and that said Letters Patent is hereby corrected as shown below:

<u>Column 19,</u>
Line 65, reads "for the-and" should read -- for the --.

<u>Column 20,</u>
Line 58, reads "subband" should read -- sub-band --.

<u>Column 21,</u>
Line 11, reads "subband" should read -- sub-band --.

Signed and Sealed this

Eleventh Day of March, 2003

JAMES E. ROGAN
*Director of the United States Patent and Trademark Office*

UNITED STATES PATENT AND TRADEMARK OFFICE
CERTIFICATE OF CORRECTION

| | | |
|---|---|---|
| PATENT NO. | : 6,452,206 B1 | Page 1 of 1 |
| APPLICATION NO. | : 09/039602 | |
| DATED | : September 17, 2002 | |
| INVENTOR(S) | : Theodore C. Harman | |

It is certified that error appears in the above-identified patent and that said Letters Patent is hereby corrected as shown below:

In column one under the "U.S. Government Interest" section delete the entire paragraph and replace with --This invention was made with government support under Grant No. F19628-95-C-0002 awarded by the US Air Force and Grant No. N00167-92-K-0052 awarded by the US Navy. The government has certain rights in this invention.--

Signed and Sealed this

Seventeenth Day of May, 2011

David J. Kappos
*Director of the United States Patent and Trademark Office*